(12) United States Patent
Wakabayashi et al.

(10) Patent No.: US 12,289,928 B2
(45) Date of Patent: Apr. 29, 2025

(54) PHOTOELECTRIC CONVERSION DEVICE

(71) Applicant: Panasonic Intellectual Property Management Co., Ltd., Osaka (JP)

(72) Inventors: Daisuke Wakabayashi, Osaka (JP); Yuuko Tomekawa, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 990 days.

(21) Appl. No.: 17/347,447

(22) Filed: Jun. 14, 2021

(65) Prior Publication Data

US 2021/0313378 A1 Oct. 7, 2021

Related U.S. Application Data

(63) Continuation of application No. PCT/JP2020/008047, filed on Feb. 27, 2020.

(30) Foreign Application Priority Data

Apr. 5, 2019 (JP) .................. 2019-072612

(51) Int. Cl.
*H01L 21/768* (2006.01)
*H01L 23/522* (2006.01)
(Continued)

(52) U.S. Cl.
CPC ....... *H10F 39/811* (2025.01); *H10F 39/8037* (2025.01); *H10F 39/805* (2025.01)

(58) Field of Classification Search
CPC ............. H01L 27/14636; H01L 21/768; H01L 23/522; H01L 27/14612; H01L 27/1462; H01L 27/14621; H01L 27/14627
See application file for complete search history.

(56) References Cited

U.S. PATENT DOCUMENTS

2005/0263839 A1 12/2005 Suzuki
2012/0326257 A1* 12/2012 Takata ................... H10K 39/32
257/432
(Continued)

FOREIGN PATENT DOCUMENTS

JP 2005-340571 12/2005
JP 2006-032714 2/2006
(Continued)

OTHER PUBLICATIONS

International Search Report of PCT application No. PCT/JP2020/008047 dated Jun. 2, 2020.

*Primary Examiner* — Herve-Louis Y Assouman
(74) *Attorney, Agent, or Firm* — Rimon P.C.

(57) ABSTRACT

A photoelectric conversion device includes: a substrate; a photodetection film including a first surface facing the substrate and a second surface opposing the first surface; first electrodes provided between the substrate and the photodetection film; a second electrode provided between the substrate and the photodetection film and including a first portion overlapped with the first surface and a second portion not overlapped therewith when viewed from a normal direction of the substrate; a third electrode provided on the second surface of the photodetection film and including a third surface facing the second surface; wiring allowing for conduction between the second and third electrodes; and a first conductive plug connected with the first portion and extending toward the substrate. Material of the first conductive plug differs from that of the second electrode. The wiring is in contact with a side surface of the photodetection film and the second portion.

14 Claims, 13 Drawing Sheets

(51) Int. Cl.
 *H04N 25/70* (2023.01)
 *H10F 39/00* (2025.01)

(56) References Cited

U.S. PATENT DOCUMENTS

| | | | |
|---|---|---|---|
| 2013/0033628 A1* | 2/2013 | Yamaguchi | H01L 27/14645 257/E31.127 |
| 2015/0001503 A1 | 1/2015 | Hirose | |
| 2015/0002719 A1 | 1/2015 | Isono et al. | |
| 2016/0093650 A1 | 3/2016 | Suzuki et al. | |
| 2016/0119562 A1* | 4/2016 | Takase | H04N 25/75 348/312 |
| 2017/0328776 A1 | 11/2017 | Shimasaki et al. | |
| 2018/0175083 A1 | 6/2018 | Takahashi | |
| 2018/0350854 A1 | 12/2018 | Miura et al. | |
| 2019/0326345 A1 | 10/2019 | Yamamoto et al. | |
| 2020/0119099 A1 | 4/2020 | Shibuta | |

FOREIGN PATENT DOCUMENTS

| | | |
|---|---|---|
| JP | 2009-231364 | 10/2009 |
| JP | 2011-243945 A | 12/2011 |
| JP | 2013-135123 | 7/2013 |
| JP | 2014-120628 | 6/2014 |
| JP | 2015-012239 A | 1/2015 |
| JP | 2016-072271 | 5/2016 |
| JP | 2018-098495 | 6/2018 |
| JP | 2019-016667 | 1/2019 |
| WO | 2012/070164 | 5/2012 |
| WO | 2014/103150 A1 | 7/2014 |
| WO | 2016/194653 | 12/2016 |
| WO | 2017/061295 | 4/2017 |
| WO | 2017/081847 | 5/2017 |

* cited by examiner

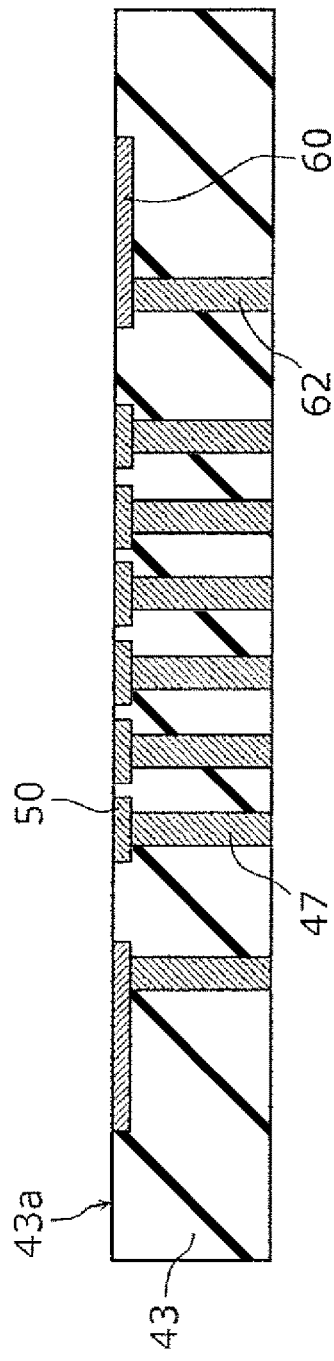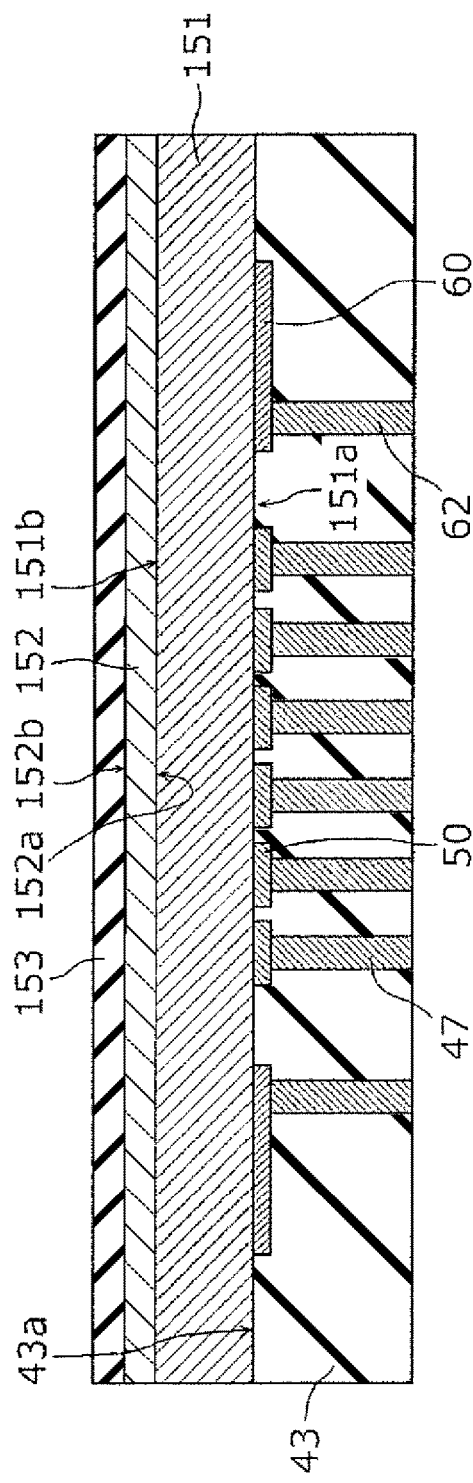

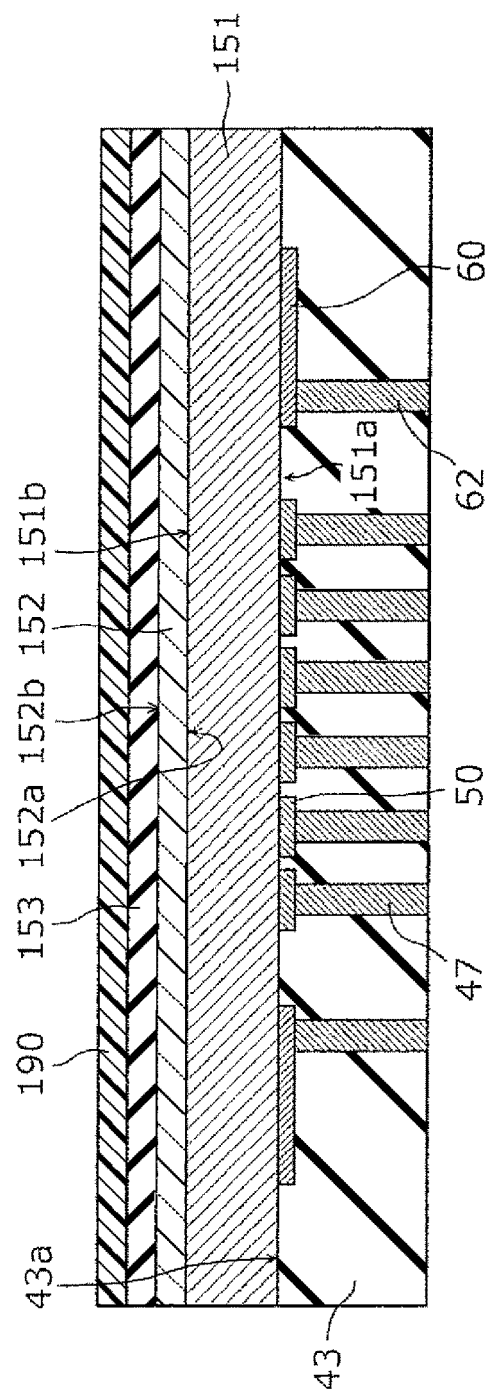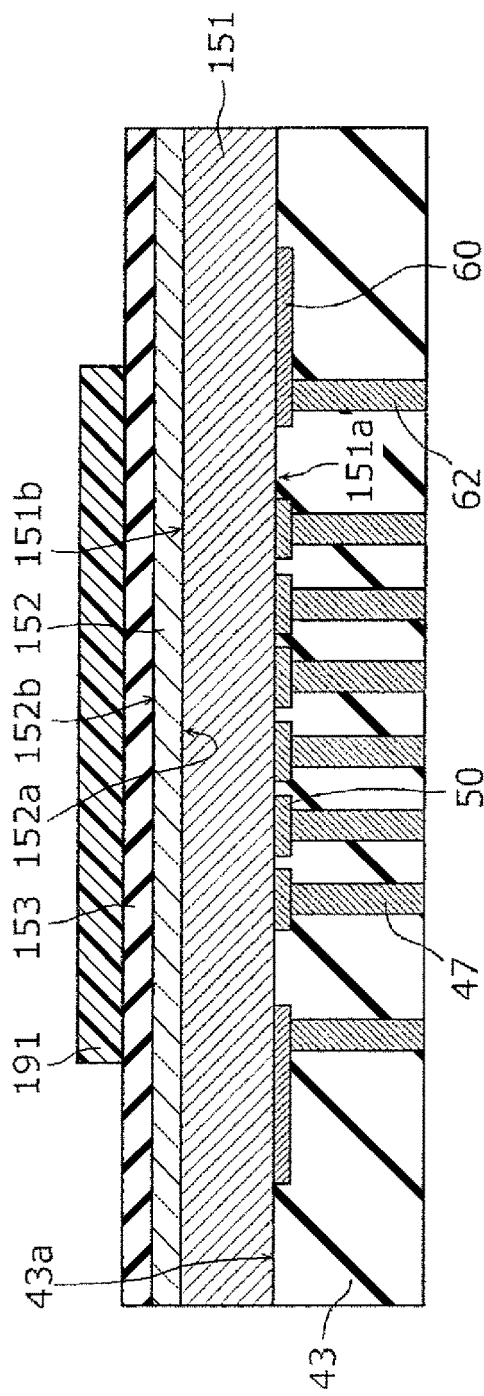

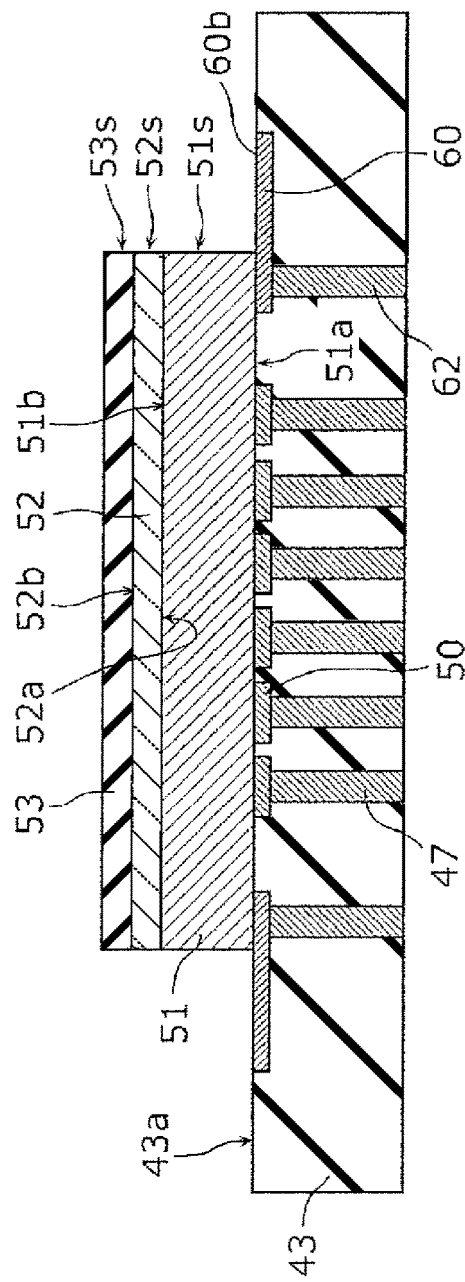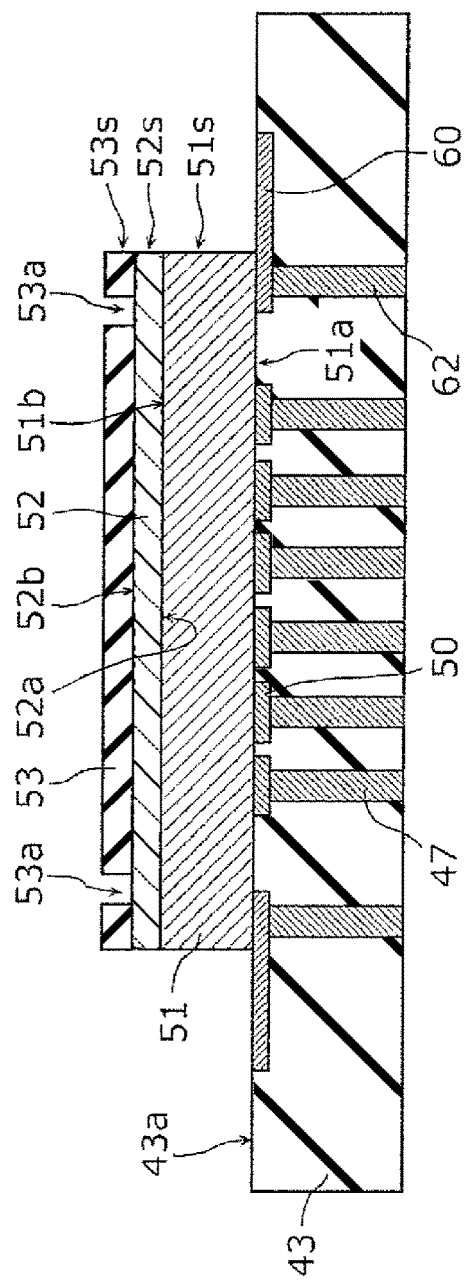

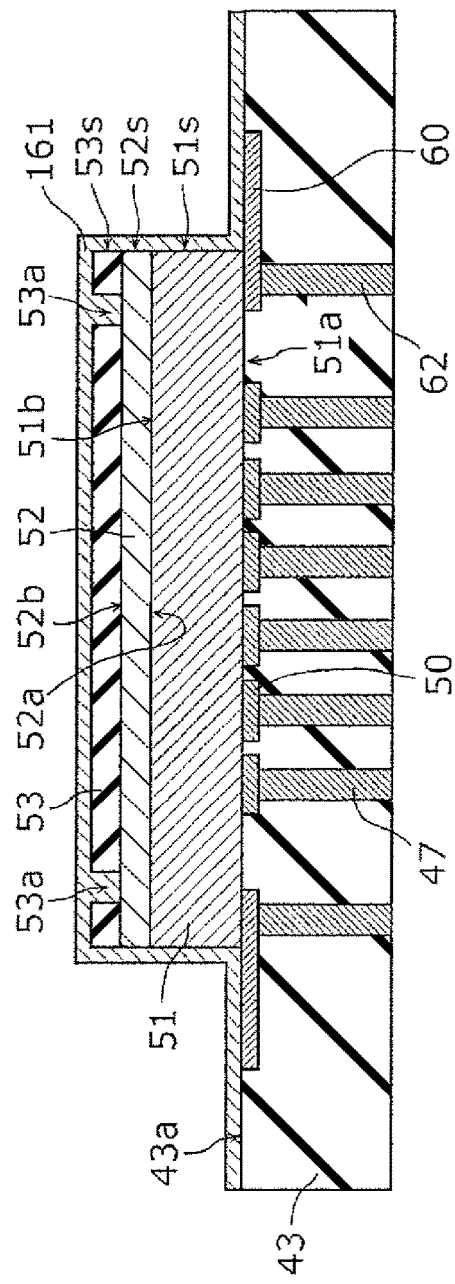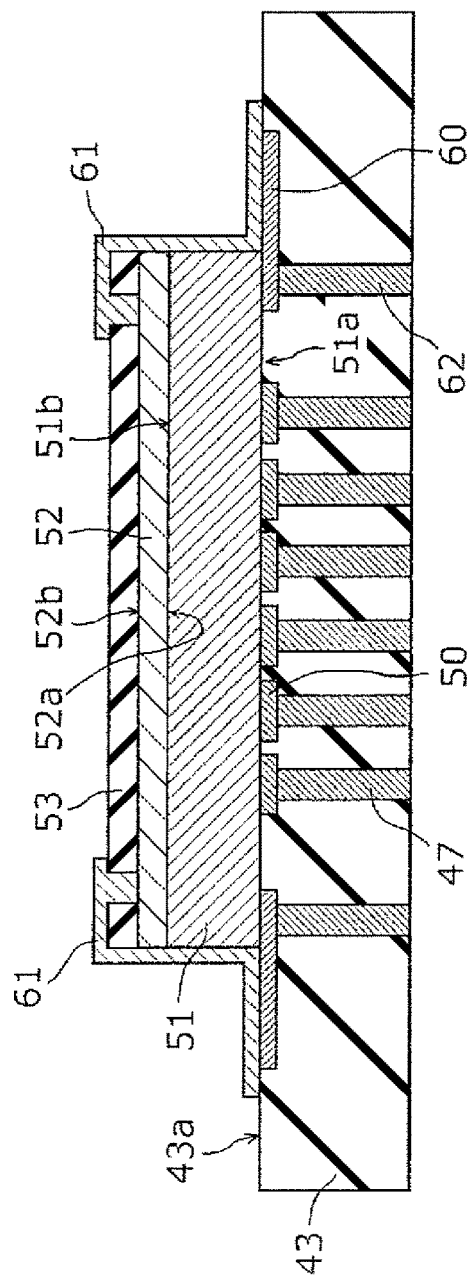

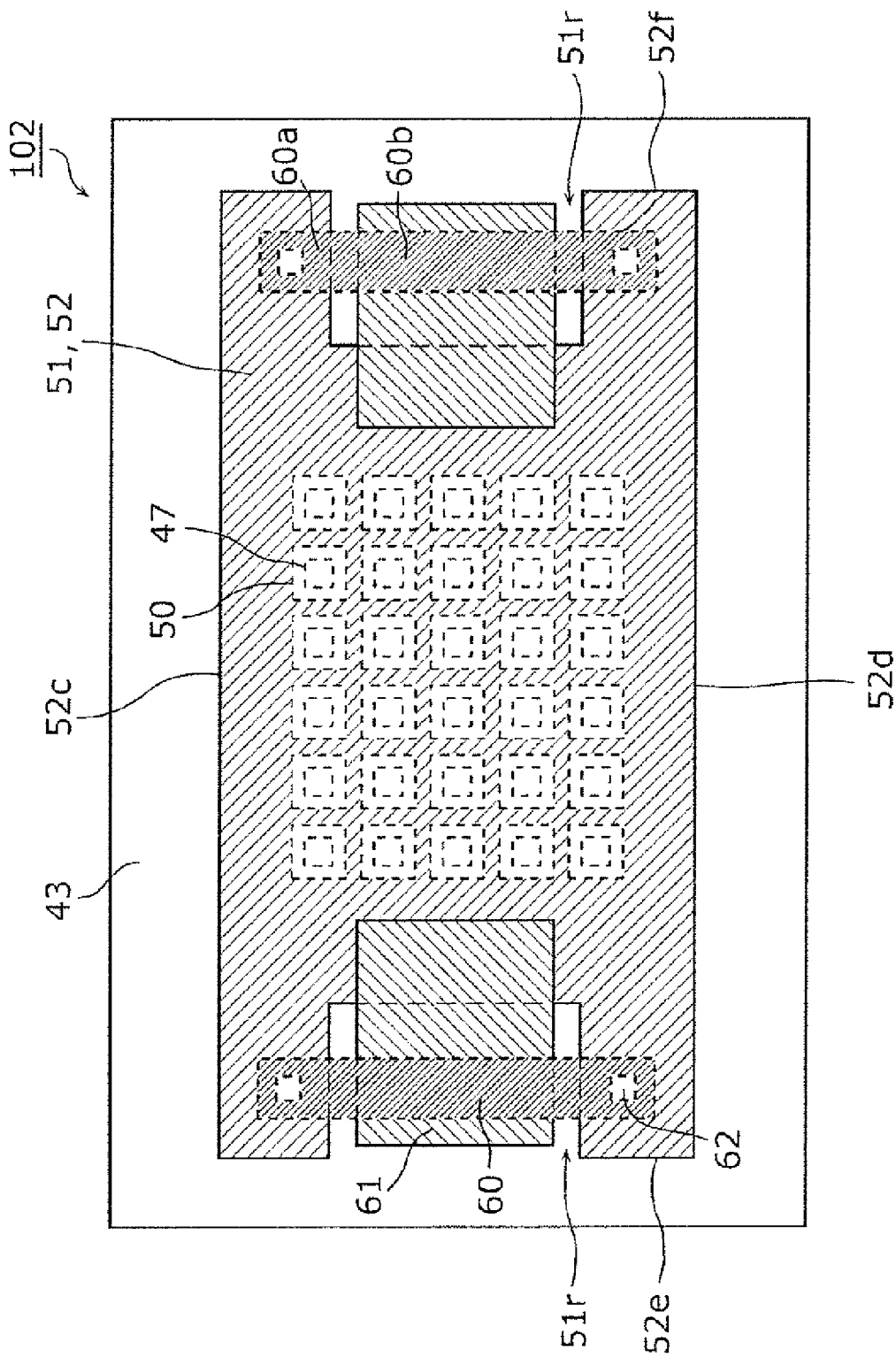

PHOTOELECTRIC CONVERSION DEVICE

BACKGROUND

1. Technical Field

The present disclosure relates to a photoelectric conversion device.

2. Description of the Related Art

Image sensors include a photodetection element that generates an electric signal according to an amount of incident light and include multiple pixels that are arranged one-dimensionally or two-dimensionally. A laminated image sensor is one of the image sensors that includes as pixels a photodetection element having a structure in which photoelectric conversion films are laminated on a substrate. Examples thereof are disclosed in Japanese Patent No. 4729275 and Japanese Unexamined Patent Application Publication No. 2019-016667.

SUMMARY

In one general aspect, the techniques disclosed here feature a photoelectric conversion device according to an aspect of the present disclosure, including: a substrate; a photodetection film that includes a first surface facing the substrate and a second surface opposite to the first surface; first electrodes that are provided between the substrate and the photodetection film; a second electrode that is provided between the substrate and the photodetection film and includes a first portion overlapping the first surface and a second portion not overlapping the first surface when viewed from a normal direction of the substrate; a third electrode that is provided on the second surface of the photodetection film and includes a third surface facing the second surface; wiring that electrically connects the second electrode and the third electrode; and a first conductive plug that is connected with the first portion of the second electrode and extends toward the substrate. Material of the first conductive plug is different from material of the second electrode. The wiring is in contact with a side surface of the photodetection film and the second portion of the second electrode.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 6A is a schematic cross-sectional view for describing one step in a method of manufacturing the image sensor according to the embodiment 1;

FIG. 6B is a schematic cross-sectional view for describing one step in the method of manufacturing the image sensor according to the embodiment 1;

FIG. 6C is a schematic cross-sectional view for describing one step in the method of manufacturing the image sensor according to the embodiment 1;

FIG. 6D is a schematic cross-sectional view for describing one step in the method of manufacturing the image sensor according to the embodiment 1;

FIG. 6E is a schematic cross-sectional view for describing one step in the method of manufacturing the image sensor according to the embodiment 1;

FIG. 6F is a schematic cross-sectional view for describing one step in the method of manufacturing the image sensor according to the embodiment 1;

FIG. 6G is a schematic cross-sectional view for describing one step in the method of manufacturing the image sensor according to the embodiment 1;

FIG. 6H is a schematic cross-sectional view for describing one step in the method of manufacturing the image sensor according to the embodiment 1;

FIG. 7 is a schematic top view of an image sensor according to a modification of the embodiment 1 without a protection film;

DETAILED DESCRIPTION

Figure 1:
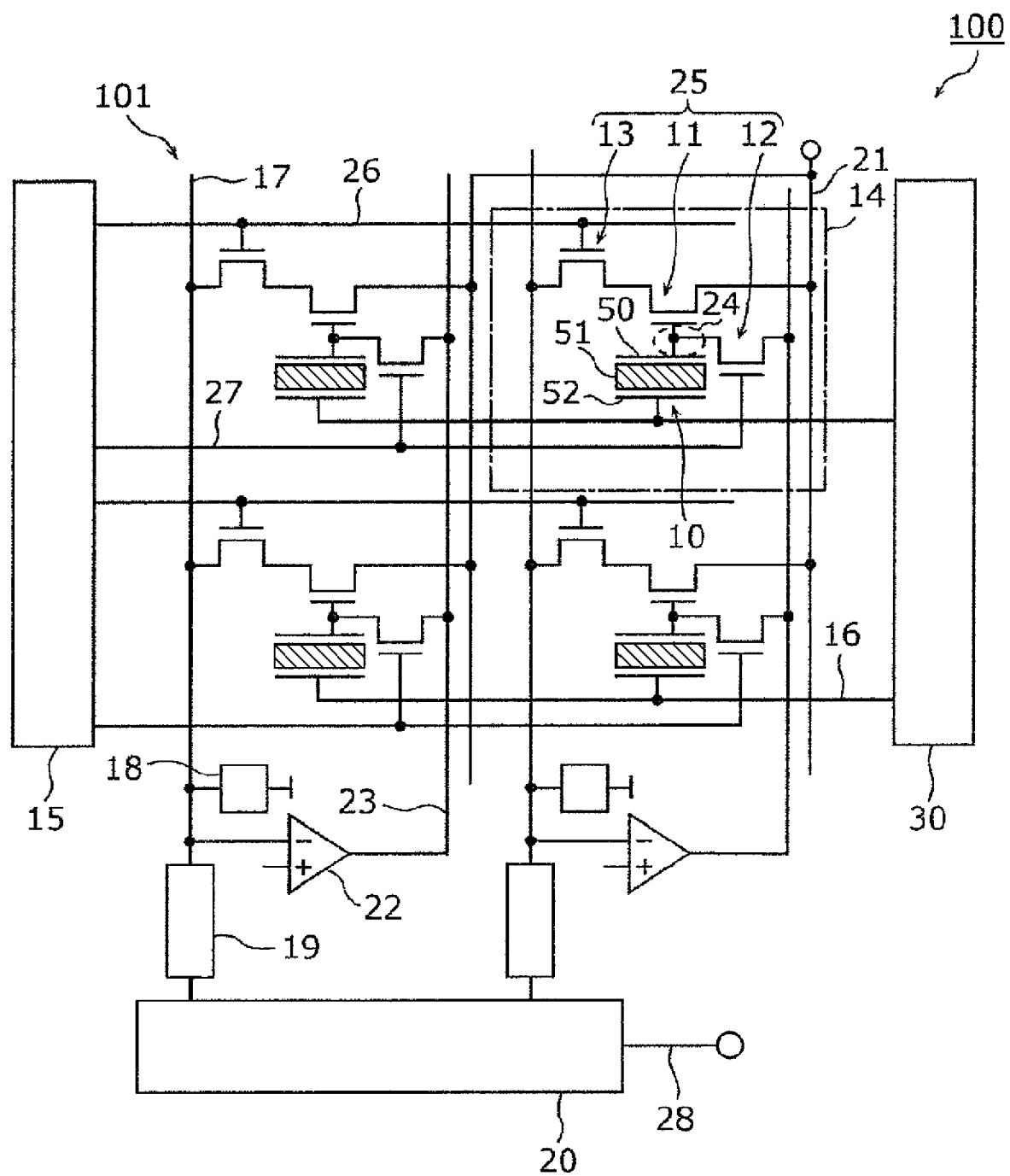
FIG. 1 is a schematic view illustrating a circuit configuration of an image capturing device according to an embodiment 1.

In a laminated image sensor, a transparent electrode may be formed on a photoelectric conversion film, and through wiring for power supply to the transparent electrode may be arranged.

The present disclosure provides a photoelectric conversion device in which the property deterioration is suppressed by protecting the through wiring from a substance such as moisture or oxygen that causes the property deterioration.

(Overview of Present Disclosure)

A photoelectric conversion device according to an aspect of the present disclosure includes: a substrate; a photodetection film that includes a first surface facing the substrate and a second surface opposite to the first surface; first electrodes that are provided between the substrate and the photodetection film; a second electrode that is provided between the substrate and the photodetection film and includes a first portion overlapped with the first surface and a second portion not overlapped with the first surface when viewed from a normal direction of the substrate; a third electrode that is provided on the second surface of the photodetection film and includes a third surface facing the second surface; wiring that electrically connects the second electrode and the third electrode; and a first conductive plug that is connected with the first portion of the second electrode and extends toward the substrate. Material of the first conductive plug is different from material of the second electrode. The wiring is in contact with a side surface of the photodetection film and the second portion of the second electrode.

When viewed from the normal direction of the substrate, the first conductive plug is overlapped with the photodetection film, and thus the photodetection film functions as a protection film for the first conductive plug. Consequently, the first conductive plug is likely to be protected from a substance such as moisture or oxygen that may cause the property deterioration, and thus it is possible to suppress the property deterioration of the photoelectric conversion device.

Additionally, for example, the photoelectric conversion device according to an aspect of the present disclosure may further include a multi-layer wiring structure that is arranged between the substrate and the photodetection film and includes inter-layer insulation layers, and the first conductive plug may pass through the inter-layer insulation layers.

With this configuration, the wiring layer is formed as multi-layer, and thus it is possible to make an area taken by the wiring layer small when the substrate is viewed in plan view and to suppress the enlargement of the element size.

Moreover, for example, in the photoelectric conversion device according to an aspect of the present disclosure, material of the wiring has higher corrosion resistance than that of the material of the first conductive plug.

With this configuration, since the wiring is formed by using the material with high corrosion resistance, the protection performance of the first conductive plug and the photodetection film is improved. Consequently, it is possible to suppress the deterioration in the quality and the performance of the photoelectric conversion device.

Furthermore, for example, in the photoelectric conversion device according to an aspect of the present disclosure, a shape in plan view, which is viewed from the normal direction of the substrate, of the photodetection film may include a recess portion, the second portion of the second electrode may be overlapped with the recess portion when viewed from the normal direction of the substrate, and the wiring may be connected to the second portion of the second electrode in the recess portion.

With this configuration, it is possible to secure a distance from a functional area in which the multiple first electrodes are provided to the side surface of the photodetection film long. Since the film quality in an end portion of the photodetection film may be deteriorated during a process of etching processing, securing of the long distance from the functional area to the side surface of the photodetection film makes it possible to prevent the end portion from being used in the functional area. Consequently, it is possible to improve the quality and the performance of the photoelectric conversion device. The functional area is an area for performing photodetection and corresponds to, for example, a pixel area in a case where the photoelectric conversion device is an image sensor.

Additionally, for example, the photoelectric conversion device according to an aspect of the present disclosure may further include: second conductive plugs, each of the second conductive plugs being in contact with a corresponding one of the first electrodes and extending toward the substrate; and a peripheral circuit that is positioned between the first conductive plug and the second conductive plugs when viewed from the normal direction of the substrate.

With this configuration, it is possible to effectively utilize the area between the first conductive plug and the second conductive plug, and thus it is possible to suppress the enlargement of the element size.

Moreover, for example, in the photoelectric conversion device according to an aspect of the present disclosure may further include a wiring layer arranged between the substrate and the photodetection film or an electric element provided on the substrate. The entirety of a portion connected with the first conductive plug in the second electrode may be included in the first portion, and the first conductive plug may be connected with the wiring layer or the electric element.

With this configuration, the first conductive plug is completely covered with the photodetection film, and thus it is possible to improve the protection performance of the first conductive plug. Consequently, it is possible to suppress the deterioration in the quality and the performance of the photoelectric conversion device.

Furthermore, for example, in the photoelectric conversion device according to an aspect of the present disclosure may further include inter-layer insulation layers that are arranged between the substrate and the photodetection film. The first electrodes may be in contact with the first surface, and the first electrodes and the second electrode may be provided in the same layer in the inter-layer insulation layers.

With this configuration, the first electrode and the second electrode are provided in the same layer, and thus it is possible to suppress the photoelectric conversion device from having a high height. Also, since the first electrode and the second electrode can be formed in the same step, the number of steps is reduced, and thus it is possible to manufacture the photoelectric conversion device easily.

Additionally, for example, in the photoelectric conversion device according to an aspect of the present disclosure, the third electrode may include a fourth surface opposite to the third surface, and the wiring may continuously cover the fourth surface of the third electrode, a side surface of the photodetection film, and the second portion of the second electrode.

With this configuration, the wiring is put in contact with the photodetection film, and thus it is possible to further suppress the enlargement of the element size.

Furthermore, for example, the photoelectric conversion device according to an aspect of the present disclosure may further include lamination structures that each include the photodetection film and the third electrode, and the lamination structures may be laminated on each other in the normal direction of the substrate.

With this configuration, for example, wavelength bands of light detected by the multiple photodetection films can be different from each other, the detection results can be utilized in various applications.

Additionally, for example, in the photoelectric conversion device according to an aspect of the present disclosure, end portions of the lamination structures may be provided in the form of stairs.

With this configuration, it is possible to secure an area in which the third electrode and the wiring are put in contact with each other, and thus it is possible to suppress unnecessary reduction of voltage in the contact portion. Consequently, it is possible to improve the quality and the performance of the photoelectric conversion device.

Moreover, for example, in the photoelectric conversion device according to an aspect of the present disclosure, side surfaces of the lamination structures may be flat over the lamination structures.

With this configuration, since the side surfaces of the electrodes and the photodetection films are flush to each other, it is possible to further suppress the enlargement of the element size.

Furthermore, for example, in the photoelectric conversion device according to an aspect of the present disclosure, the wiring may have a film shape. With this configuration, the wiring in the film shape that is thinner than the through electrode covers the side surface of the photodetection film, and thus it is possible to suppress the enlargement of the element size. As described above, according to this aspect, it is possible to suppress the enlargement of the element size and to implement a photoelectric conversion device with high quality and high performance.

The photoelectric conversion device according to an aspect of the present disclosure includes: a substrate; a photodetection film that includes a first surface facing the substrate and a second surface opposite to the first surface; first electrodes that are provided between the substrate and the photodetection film; a second electrode that is provided between the substrate and the photodetection film and includes a first portion overlapped with the first surface and a second portion not overlapped with the first surface when viewed from a normal direction of the substrate; a third electrode that is provided on the second surface of the photodetection film and includes a third surface facing the second surface; wiring that electrically connects the second electrode and the third electrode; and a first conductive plug that is connected with the first portion of the second electrode and extends toward the substrate. The first conductive plug includes a portion that is not overlapped with the second electrode when viewed from the normal direction of the substrate.

In the present disclosure, all or a part of circuits, units, devices, members, or portions, or all or a part of functional blocks in a block diagram may be, for example, executed by one or more electronic circuits including a semiconductor device, a semiconductor integrated circuit (IC), or a large scale integration (LSI). The LSI or the IC may be integrated into one chip or may be a combination of multiple chips. For example, functional blocks other than a storage element may be integrated into one chip. Although it is called the LSI or the IC herein, the name may be changed depending on the degree of integration, and it may be called a system LSI, a very large scale integration (VLSI), or an ultra large scale integration (ULSI). A field programmable gate array (FPGA), which is programmed after manufacturing the LSI, or a reconfigurable logic device, which can reconfigure an embedding relationship inside the LSI or can setup a circuit section inside the LSI, can be used for the same purpose.

Additionally, a function or an operation of all or a part of the circuits, units, devices, members, or portions may be executed by software processing. In this case, the software is recorded in one or more non-transitory recording mediums such as ROMs, optical discs, and hard disc drives, and when the software is executed by a processor, a function identified by the software is executed by the processor and peripheral devices. A system or a device may include one or more non-transitory recording mediums in which the software is recorded, the processor, and a required hardware device, which is an interface, for example.

Hereinafter, embodiments are described in specific with reference to the drawings.

The embodiments described below all show comprehensive or specific examples. Numbers, shapes, materials, constituents, arrangement positions and connected forms of the constituents, manufacturing steps, an order of the manufacturing steps, and so on shown in the following embodiments are examples and are not intended to limit the present disclosure. Some of the constituents not described in an independent claim in the following embodiments are described as optional constituents.

The drawings are schematic views and are not necessarily precisely illustrated. Therefore, for example, the scale and the like in the drawings are not necessarily coincide with the actual scale. In the drawings, the substantially same configurations are marked with the same reference signs, and duplicated descriptions are omitted or simplified.

In this specification, a term indicating a relationship between elements such as flush and a term indicating a shape of an element such as rectangular, and a numerical range are not the expressions only indicating strict meanings but are the expressions meaning that there is also included a substantial equivalent and, for example, a difference of about few %.

In this specification, terms "above" and "below" do not indicate an up direction (vertically above) and a down direction (vertically below) in an absolute space spatial recognition and are used as terms defined by a relative positional relationship based on a lamination order in a lamination configuration. The terms "above" and "below" are applied to not only a case where two constituents are arranged at an interval from each other while another constituent is arranged therebetween but also to a case where the two constituents are arranged close to each other and are put in contact with each other.

Embodiment 1

[Overview of Image Capturing Device Including Image Sensor]

First, an image capturing device including an image sensor according to this embodiment is generally described.

FIG. 1 is a schematic view illustrating a circuit configuration of an image capturing device 100 according to this embodiment. As illustrated in FIG. 1, the image capturing device 100 is an example of a photoelectric conversion device and includes an image sensor 101, which includes multiple pixels 14, and peripheral circuits.

The multiple pixels 14 are arrayed on a semiconductor substrate two-dimensionally or in a row direction and a column direction and form a pixel area. The image sensor 101 may be a line sensor. In this case, the multiple pixels 14 may be arrayed in one column. In this specification, the row direction and the column direction are directions in which a row and a column extend, respectively. To be specific, a vertical direction is the column direction, and a horizontal direction is the row direction.

Each pixel 14 includes a photodetection unit 10 and a charge detection circuit 25. The photodetection unit 10 includes a pixel electrode 50, a photodetection film 51, and a transparent electrode 52. A specific configuration of the photodetection unit 10 is described later. The charge detection circuit 25 includes an amplification transistor 11, a reset transistor 12, and an address transistor 13.

The image capturing device 100 includes a voltage control element that applies a predetermined voltage to the transparent electrode 52. The voltage control element includes, for example, a voltage control circuit, a voltage generation circuit such as a constant-voltage source, and a voltage reference line such as a ground line. The voltage applied by the voltage control element is called a control voltage. In this embodiment, the image capturing device 100 includes a voltage control circuit 30 as a voltage control element.

The voltage control circuit 30 may generate a constant control voltage or may generate multiple control voltages of different values. For example, the voltage control circuit 30 may generate control voltages of two or more different values, or may generate a control voltage that is continuously changed within a predetermined range. The voltage control circuit 30 determines a value of the control voltage to be generated based on a command by an operator who operates the image capturing device 100 or a command by another control unit or the like included in the image capturing device 100, and generates the control voltage of the determined value. The voltage control circuit 30 is provided outside a photosensitive area as one of the peripheral circuits.

For example, the voltage control circuit 30 generates two or more different control voltages and applies the control voltages to the transparent electrode 52. Thus, the spectral sensitivity properties of the photodetection film 51 are changed. This change in the spectral sensitivity properties includes the spectral sensitivity properties with which the sensitivity of the photodetection film 51 to the light that should be detected becomes zero. Thus, for example, in the image capturing device 100, while the pixels 14 read detection signals from each of the rows, the voltage control circuit 30 applies the control voltages that make the sensitivity of the photodetection film 51 zero to the transparent electrode 52. Thus, it is possible to make an effect of incident light during the reading of the detection signals almost zero. Consequently, it is possible to implement the global shutter operation even when the detection signals are read substantially from each row.

In this embodiment, as illustrated in FIG. 1, the voltage control circuit 30 applies the control voltages to the transparent electrode 52 in each of the pixels 14 arrayed in the row direction through an opposite electrode signal line 16. Thus, the voltage control circuit 30 changes a voltage between the pixel electrode 50 and the transparent electrode 52 and switches the spectral sensitivity properties in the photodetection unit 10. Otherwise, the voltage control circuit 30 may implement the electronic shutter operation by applying the control voltages so as to obtain the spectral sensitivity properties with which the sensitivity to the light becomes zero in a predetermined timing during image capturing. The voltage control circuit 30 may apply the control voltage to the pixel electrode 50.

In order to emit light to the photodetection unit 10 and accumulate electrons in the pixel electrode 50 as signal charges, the pixel electrode 50 is set to have a higher potential than that of the transparent electrode 52. In this case, the moving direction of the electrons is opposite of the moving direction of holes, and thus a current flows from the pixel electrode 50 to the transparent electrode 52. On the other hand, in order to emit light to the photodetection unit 10 and accumulate the holes in the pixel electrode 50 as signal charges, the pixel electrode 50 is set to have a lower potential than that of the transparent electrode 52. In this case, a current flows from the transparent electrode 52 to the pixel electrode 50.

The pixel electrode 50 is connected to a gate electrode of the amplification transistor 11, and the signal charges collected by the pixel electrode 50 are accumulated in a charge accumulation node 24 positioned between the pixel electrode 50 and the gate electrode of the amplification transistor 11. In this embodiment, the signal charges are the holes. Otherwise, the signal charges may be the electrons.

The signal charges accumulated in the charge accumulation node 24 are applied to the gate electrode of the amplification transistor 11 as a voltage according to the amount of the signal charges. The amplification transistor 11 is included in the charge detection circuit 25 and amplifies the voltage applied to the gate electrode. The address transistor 13 selectively reads the amplified voltage as a signal voltage. The address transistor 13 is also referred to as a row selection transistor. Either one of a source electrode or a drain electrode of the reset transistor 12 is connected to the pixel electrode 50, and the reset transistor 12 resets the signal charges accumulated in the charge accumulation node 24. In other words, the reset transistor 12 resets the potentials of the gate electrode of the amplification transistor 11 and the pixel electrode 50.

In order to selectively perform the above-described operations in the multiple pixels 14, the image capturing device 100 includes a power source wiring 21, a vertical signal line 17, an address signal line 26, and a reset signal line 27. These wiring and signal lines are connected to the pixels 14. To be specific, the power source wiring 21 is connected to either one of a source electrode or a drain electrode of the amplification transistor 11. The vertical signal line 17 is connected to the other one of a source electrode and a drain electrode of the address transistor 13, which is the one not connected to the charge accumulation node 24. The address signal line 26 is connected to a gate electrode of the address transistor 13. The reset signal line 27 is connected to a gate electrode of the reset transistor 12.

The peripheral circuits include at least one of electric circuits as represented by a vertical scanning circuit 15, a horizontal signal reading circuit 20, multiple column signal processing circuits 19, multiple load circuits 18, multiple differential amplifiers 22, or the voltage control circuit 30. The vertical scanning circuit 15 is also referred to as a row scanning circuit. The horizontal signal reading circuit 20 is also referred to as a column scanning circuit. The column signal processing circuits 19 are also referred to as column signal accumulation circuits. The differential amplifiers 22 are also referred to as feedback amplifiers.

The vertical scanning circuit 15 is connected to the address signal line 26 and the reset signal line 27, selects the multiple pixels 14 arranged in each row by a row unit, and performs the reading of the signal voltages and the resetting of the potential of the pixel electrode 50. The power source wiring 21 supplies a predetermined power source voltage to each pixel 14. The horizontal signal reading circuit 20 is electrically connected to the multiple column signal processing circuits 19. Each of the column signal processing circuits 19 is electrically connected to the pixels 14 arranged in a corresponding column through the vertical signal line 17 corresponding to each column. Each of the load circuit 18 is electrically connected to a corresponding vertical signal line 17. The load circuit 18 and the amplification transistor 11 form a source follower circuit.

The multiple differential amplifiers 22 are provided to correspond to each column. An input terminal on a negative side of each differential amplifier 22 is connected to a corresponding vertical signal line 17. An output terminal of the differential amplifier 22 is connected to the pixels 14 through a feedback line 23 corresponding to each column.

The vertical scanning circuit 15 applies a row selection signal that controls on and off of the address transistors 13 to the gate electrodes of the address transistors 13 through the address signal line 26. Thus, the row as a reading target is scanned and selected. The signal voltages are read from the pixels 14 in the selected row to the vertical signal line 17. The vertical scanning circuit 15 applies a reset signal that controls on and off of the reset transistors 12 to the gate electrodes of the reset transistors 12 through the reset signal line 27. Thus, the row of the pixels 14 as the target of the reset operation is selected. The vertical signal lines 17 transmit the signal voltages that are read from the pixels 14 selected by the vertical scanning circuit 15 to the column signal processing circuits 19.

The column signal processing circuits 19 perform noise suppression signal processing as represented by the correlated double sampling, analog-digital conversion (AD conversion), and the like.

The horizontal signal reading circuit 20 sequentially reads signals from the multiple column signal processing circuits 19 to a horizontal common signal line 28.

The differential amplifier 22 is connected to the other one of the drain electrode and the source electrode of the reset transistor 12, which is the one not connected to the pixel electrode 50, through the feedback line 23. Therefore, when the address transistor 13 and the reset transistor 12 are in a conductive state, the differential amplifier 22 receives an output value of the address transistor 13 into a negative terminal. The differential amplifier 22 performs a feedback operation to make a gate potential of the amplification transistor 11 a predetermined feedback voltage. In this case, an output voltage value of the differential amplifier 22 is a positive voltage that is 0 V or close to 0 V. The feedback voltage means an output voltage of the differential amplifier 22.

Figure 2:
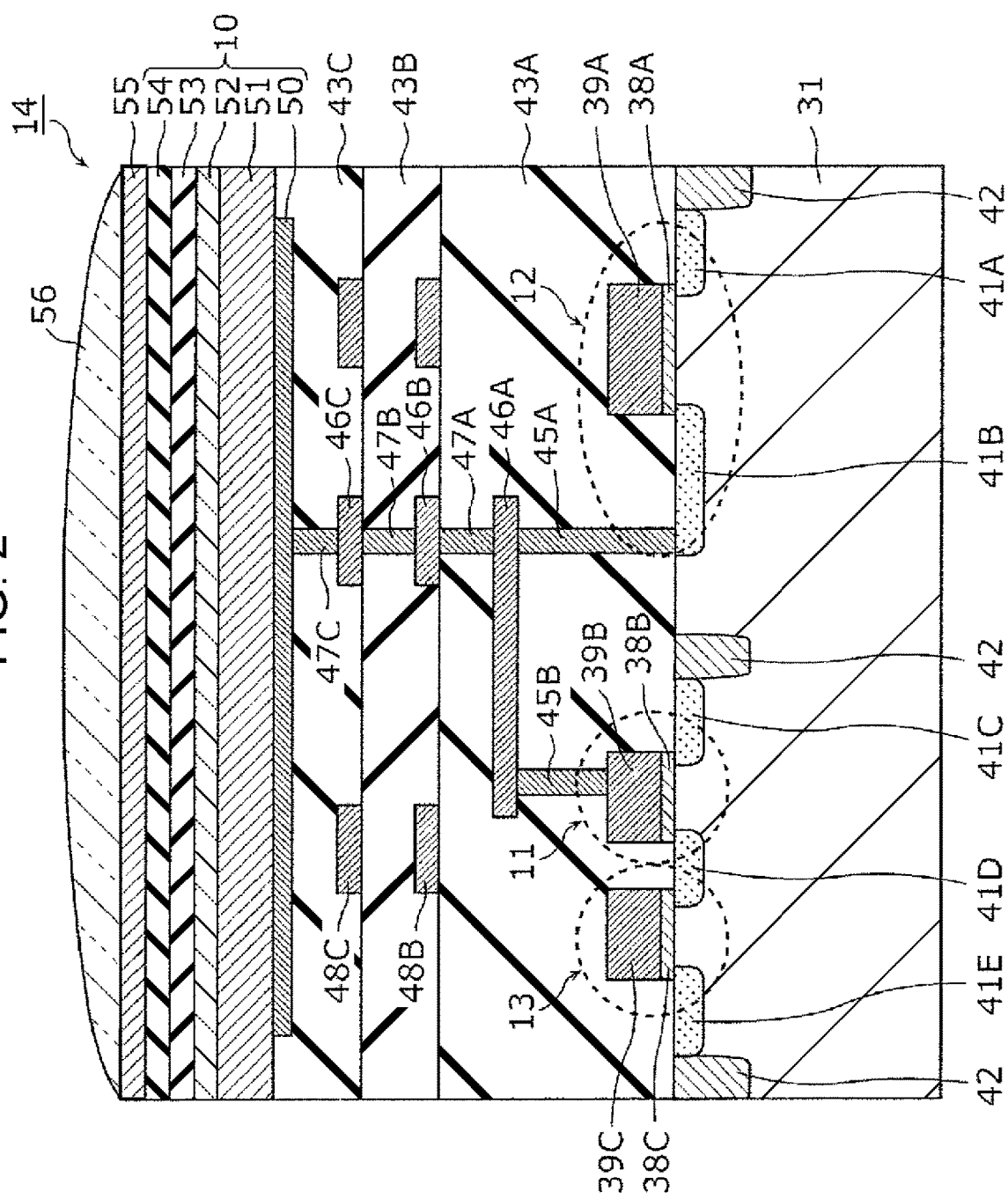
FIG. 2 is a cross-sectional view schematically illustrating a cross section of a device configuration of a pixel of the image capturing device according to the embodiment 1.

Hereinafter, a specific device configuration of each pixel 14 in the image capturing device 100 is described with reference to FIG. 2. FIG. 2 is a cross-sectional view schematically illustrating a cross section of the device configuration of the pixel 14 in the image capturing device 100 according to this embodiment.

As illustrated in FIG. 2, the pixel 14 includes a semiconductor substrate 31, the charge detection circuit 25 (not illustrated), and the photodetection unit 10. The semiconductor substrate 31 is, for example, a p-type silicon substrate. The charge detection circuit 25 detects the signal charges captured by the pixel electrode 50 and outputs the signal voltage. The charge detection circuit 25 includes the amplification transistor 11, the reset transistor 12, and the address transistor 13 and is formed on the semiconductor substrate 31.

Each of the amplification transistor 11, the reset transistor 12, and the address transistor 13 is an example of an electric element formed on the semiconductor substrate 31. Each of the amplification transistor 11, the reset transistor 12, and the address transistor 13 is, for example, a metal oxide semiconductor field effect transistor (MOSFET). To be specific, each of the amplification transistor 11, the reset transistor 12, and the address transistor 13 is an n-channel MOSFET; however, it may be a p-channel MOSFET.

The amplification transistor 11 includes n-type impurity areas 41C and 41D, a gate insulation layer 38B, and a gate electrode 39B. The n-type impurity areas 41C and 41D are formed in the semiconductor substrate 31 and each function as a drain or a source. The gate insulation layer 38B is positioned on the semiconductor substrate 31. The gate electrode 39B is positioned on the gate insulation layer 38B.

The reset transistor 12 includes n-type impurity areas 41A and 41B, a gate insulation layer 38A, and a gate electrode 39A. The n-type impurity areas 41A and 41B are formed in the semiconductor substrate 31 and each function as a drain or a source. The gate insulation layer 38A is positioned on the semiconductor substrate 31. The gate electrode 39A is positioned on the gate insulation layer 38A.

The address transistor 13 includes the n-type impurity area 41D and an n-type impurity area 41E, a gate insulation layer 38C, and a gate electrode 39C. The n-type impurity areas 41D and 41E are formed in the semiconductor substrate 31 and each function as a drain or a source. The gate insulation layer 38C is positioned on the semiconductor substrate 31. The gate electrode 39C is positioned on the gate insulation layer 38C.

The gate insulation layers 38A, 38B, and 38C are each formed by using an insulating material. For example, the gate insulation layers 38A, 38B, and 38C have a single layer structure or a lamination structure of a silicon dioxide film or a silicon nitride film.

The gate electrodes 39A, 39B, and 39C are each formed by using a conductive material. For example, the gate electrodes 39A, 39B, and 39C are formed by using polysilicon to which the conductivity is applied by doping an impurity. Otherwise, the gate electrodes 39A, 39B, and 39C may be formed by using a metallic material such as copper.

The n-type impurity areas 41A, 41B, 41C, 41D and 41E are formed by, for example, doping an n-type impurity such as phosphorus (P) to the semiconductor substrate 31 by ion implantation and the like. In the example illustrated in FIG. 2, the n-type impurity area 41D is shared by the amplification transistor 11 and the address transistor 13. Thus, the amplification transistor 11 and the address transistor 13 are connected in series. The n-type impurity area 41D may be divided in two n-type impurity areas. The two n-type impurity areas may be electrically connected through a wiring layer.

In the semiconductor substrate 31, element separation areas 42 are provided between adjacent pixels 14 and between the amplification transistor 11 and the reset transistor 12, respectively. The adjacent pixels 14 are electrically separated from each other by the element separation area 42. Also, leaking of the signal charges accumulated in the charge accumulation node 24 is suppressed.

A multi-layer wiring structure is provided on an upper surface of the semiconductor substrate 31. The multi-layer wiring structure includes multiple inter-layer insulation layers, one or more wiring layers, one or more plugs, and one or more contact plugs. To be specific, inter-layer insulation layers 43A, 43B, and 43C are laminated on the upper surface of the semiconductor substrate 31. Contact plugs 45A and 45B, a wiring 46A, and a conductive plug 47A are embedded in the inter-layer insulation layer 43A. A wiring 46B and a conductive plug 47B are embedded in the inter-layer insulation layer 43B. A wiring 46C and a conductive plug 47C are embedded in the inter-layer insulation layer 43C.

The contact plug 45A is connected with the n-type impurity area 41B of the reset transistor 12. The contact plug 45B is connected with the gate electrode 39B of the amplification transistor 11. The wiring 46A connects the contact plug 45A and the contact plug 45B with each other. Thus, the n-type impurity area 41B of the reset transistor 12 is electrically connected with the gate electrode 39B of the amplification transistor 11.

The wiring 46A is connected to the pixel electrode 50 through the conductive plugs 47A, 47B, and 47C and the wirings 46B and 46C. Thus, the n-type impurity area 41B, the gate electrode 39B, the contact plugs 45A and 45B, the wirings 46A, 46B, and 46C, the conductive plugs 47A, 47B, and 47C, and the pixel electrode 50 constitute the charge accumulation node 24.

As illustrated in FIG. 2, multiple wirings 48B and 48C that are not directly electrically connected to the pixel electrode 50 may be provided in the multi-layer wiring structure. For example, the wirings 48B are positioned in the same layer as that of the wiring 46B and are embedded in the inter-layer insulation layer 43B. The wirings 48C are positioned in the same layer as that of the wiring 46C and are embedded in the inter-layer insulation layer 43C. Each of the wirings 48B and 48C function as a part of, for example, the opposite electrode signal line 16, the vertical signal line 17, the power source wiring 21, the feedback line 23, the address signal line 26, or the reset signal line 27. At least either one of the wiring 48B or the wiring 48C may be connected with a power supply-through wiring 62 described later. At least either one of the wiring 48B or 48C may be provided in a peripheral area, not in the pixel area.

The photodetection unit 10 is provided on the inter-layer insulation layer 43C. The photodetection unit 10 includes the transparent electrode 52, the photodetection film 51, and the pixel electrode 50 that is positioned closer to the semiconductor substrate 31 than the transparent electrode 52. The photodetection film 51 is arranged between the transparent electrode 52 and the pixel electrode 50. Additionally, the photodetection unit 10 includes an insulation layer 53 formed on at least a part of an upper surface of the transparent electrode 52. The photodetection unit 10 further includes a protection film 54.

As illustrated in FIG. 2, the pixel 14 includes a color filter 55 above the transparent electrode 52 in the photodetection unit 10. The pixel 14 further includes a micro-lens 56 on the color filter 55. The pixel 14 may not include the insulation layer 53, the protection film 54, the color filter 55, and the micro-lens 56.

Hereinafter, structures of the photodetection unit 10 of each of the multiple pixels 14 and a vicinity of an end portion of the photodetection film 51 are described with reference to FIGS. 3, 4, and 5.

Figure 3:
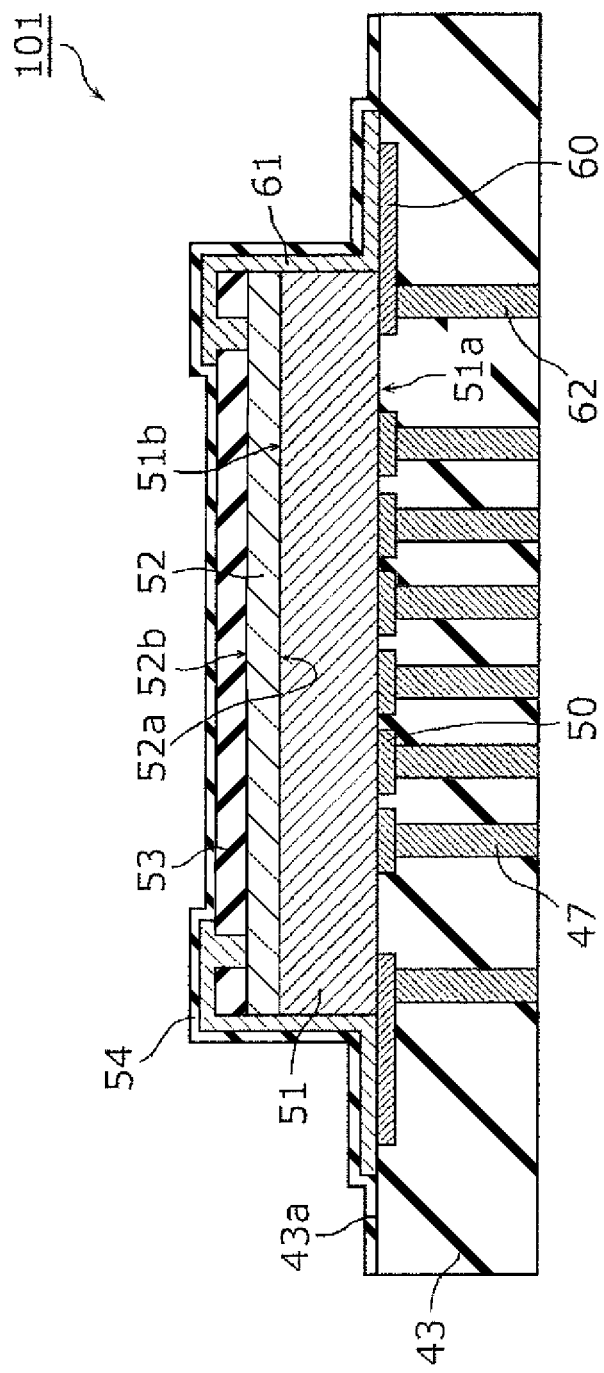
FIG. 3 is a schematic cross-sectional view of an image sensor according to the embodiment 1.

FIG. 3 is a schematic cross-sectional view of the image sensor 101 according to this embodiment. FIG. 4 is a schematic top view of the image sensor 101 according to this embodiment without the protection film 54. FIG. 5 is a schematic cross-sectional view illustrating in closeup the vicinity of the end portion of the photodetection film 51 in the image sensor 101 according to this embodiment.

The drawings hereinafter except FIG. 12 collectively illustrate the inter-layer insulation layers 43A, 43B, and 43C illustrated in FIG. 2 as an inter-layer insulation layer 43. The conductive plugs 47A, 47B, and 47C are collectively illustrated as a conductive plug 47. Illustration of the semiconductor substrate 31 and the transistors, the wirings, the plugs, and so on is omitted.

In this specification, a configuration on a lower layer side of the photodetection film 51 may be collectively called a circuit unit. To be specific, the circuit unit includes the semiconductor substrate 31 and the inter-layer insulation layer 43, the transistors, the wirings, and the plugs formed on the surfaces and in the insides of the semiconductor substrate 31 and the inter-layer insulation layer 43, and so on. For example, the pixel electrodes 50 and control electrodes 60 are also included in the circuit unit.

Figure 4:
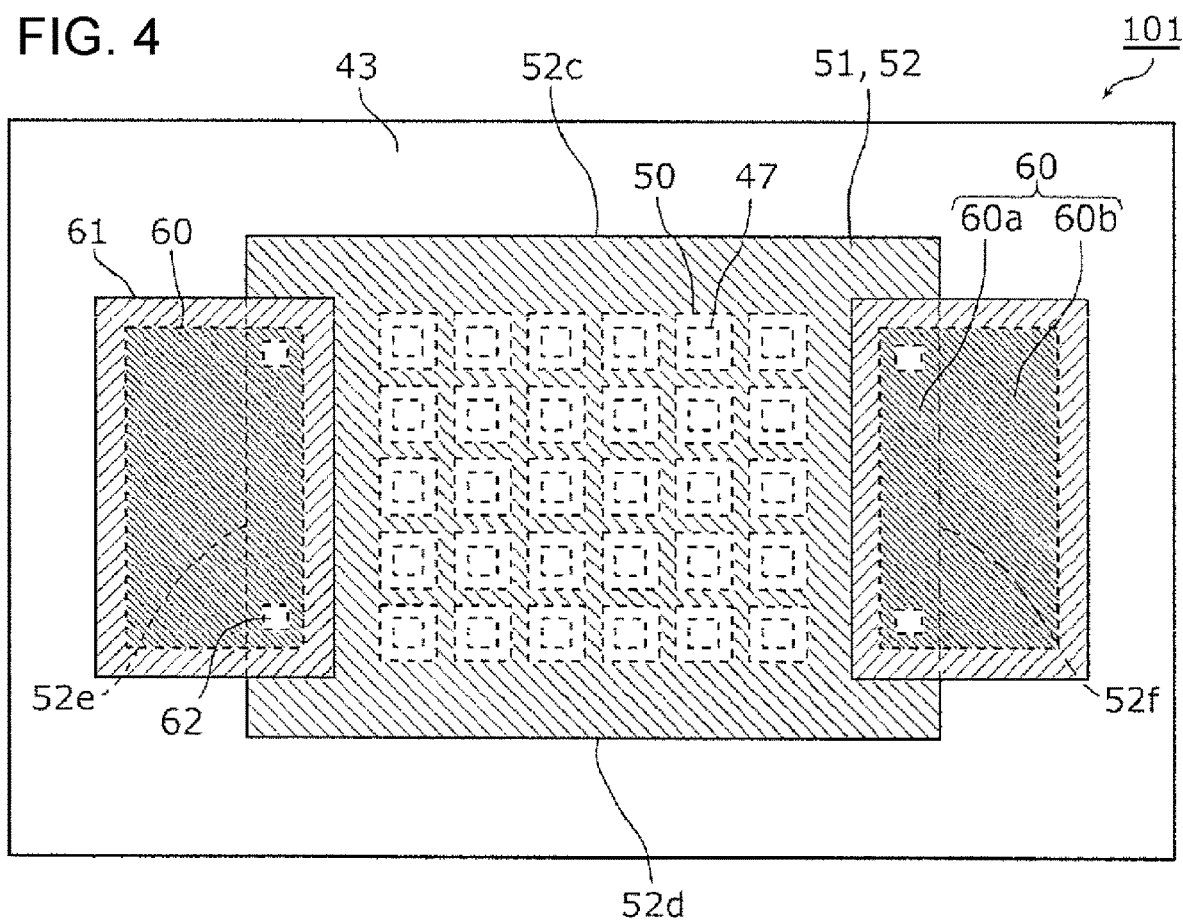
FIG. 4 is a schematic top view of the image sensor according to the embodiment 1 without a protection film.

In FIG. 4, for the sake of clarifying the shapes of the photodetection film 51, the control electrodes 60, and connection portions 61, they are shaded with different kinds of hatched lines, respectively. In this case, the shade on the photodetection film 51 is not applied to a portion that is overlapped with the pixel electrodes 50, the control electrodes 60, and the connection portions 61. Likewise, the shade on the connection portions 61 is not applied to a portion that is overlapped with the control electrodes 60. This rule is similarly set for FIG. 7 described later.

The image sensor 101 includes the multiple pixels 14 as described above. To be specific, as illustrated in FIGS. 3, 4, and 5, the image sensor 101 includes the multiple pixel electrodes 50, the photodetection film 51, and the transparent electrode 52.

In this embodiment, the photodetection film 51 and the transparent electrode 52 in each pixel 14 are connected with the photodetection film 51 and the transparent electrode 52 in an adjacent pixel 14, respectively, and form an integral photodetection film 51 and an integral transparent electrode 52, respectively. The photodetection film 51 may be divided based on the corresponding pixels 14. The transparent electrodes 52 may be integrally connected with each other based on each row or column of the pixels 14 arranged two-dimensionally. On the other hand, the pixel electrode 50 in each pixel 14 is not connected with the pixel electrode 50 in an adjacent pixel 14 and is independent. In other words, one pixel electrode 50 is provided in every pixels 14.

The image sensor 101 further includes the control electrodes 60, the connection portions 61, and the power supply-through wirings 62. The control electrodes 60, the connection portions 61, and the power supply-through wirings 62 constitute a part of the opposite electrode signal line 16.

The multiple pixel electrodes 50 are an example of multiple first electrodes provided on a lower surface 51a side of the photodetection film 51. The multiple pixel electrodes 50 are arrayed and embedded one-dimensionally or two-dimensionally such that an upper surface of each pixel electrode 50 is exposed in an upper surface 43a of the inter-layer insulation layer 43. FIG. 4 illustrates an example where a total of 30 pixel electrodes 50 are arrayed in five rows and six columns; however, the number of the pixel electrodes 50 is not particularly limited. As illustrated in FIGS. 3 and 5, the multiple pixel electrodes 50 are put in contact with the lower surface 51a of the photodetection film 51. The conductive plugs 47 are connected to the multiple pixel electrodes 50, respectively. The conductive plugs 47 are an example of multiple second conductive plugs extending toward the semiconductor substrate 31.

The conductive plugs 47 and the power supply-through wirings 62 are formed of copper or silver.

The multiple pixel electrodes 50 are formed by using, for example, a metal such as aluminum or copper, or a conductive material such as polysilicon into which an impurity is doped and the conductivity is applied. The multiple pixel electrodes 50 may be formed of the same material as that of the control electrodes 60 described later. The multiple pixel electrodes 50 have the same size and the same shape, for example.

Figure 5:
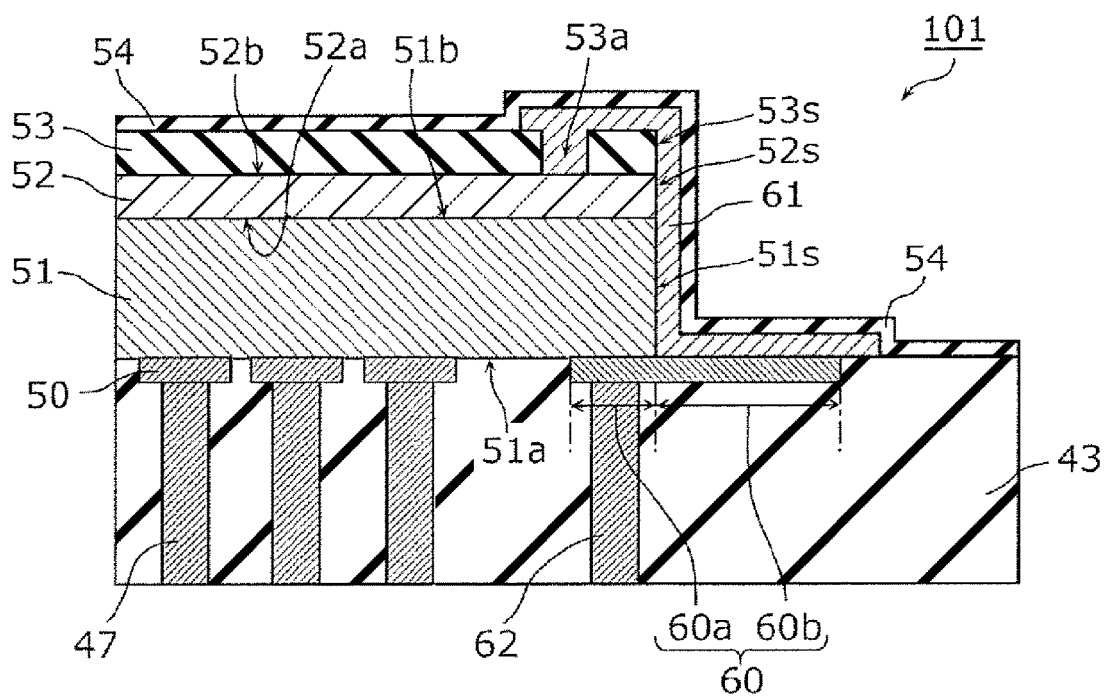
FIG. 5 is a schematic cross-sectional view illustrating in closeup a vicinity of an end portion of a photodetection film in the image sensor according to the embodiment 1.

As illustrated in FIGS. 3 and 5, the photodetection film 51 includes the lower surface 51a and an upper surface 51b. The lower surface 51a is an example of a first surface facing the semiconductor substrate 31. The upper surface 51b is an example of a second surface on the opposite side of the lower surface 51a.

In this specification, "two surfaces face each other" means not only that the two surfaces directly face each other and another member is not arranged therebetween, but also that another member is arranged therebetween. In other words, "face each other" includes a case where two surfaces face each other with another member arranged therebetween. Additionally, "face each other" also means that two surfaces face each other and are in contact with each other.

In this embodiment, the photodetection film 51 is arranged on the upper surface 43a of the inter-layer insulation layer 43 so as to cover the multiple pixel electrodes 50 and the power supply-through wirings 62. To be specific, as illustrated in FIG. 4, the photodetection film 51 is overlapped with the multiple pixel electrodes 50 and a part of the control electrodes 60 when viewed from a normal direction of the semiconductor substrate 31. To be more specific, the photodetection film 51 is put in contact with and covers the multiple pixel electrodes 50 and first portions 60a of the control electrodes 60. Hereinafter, the case of viewing from the normal direction of the semiconductor substrate 31 is simply described as "viewed from the top".

The photodetection film 51 generates a signal charge according to the intensity of the incident light by photoelectric converting the incident light. The photodetection film 51 is formed of, for example, an organic semiconductor. The photodetection film 51 may include one or more organic semiconductor layers. For example, the photodetection film 51 may include a carrier transportation layer that transports the electrons or the holes, a blocking layer that blocks the carriers, and the like in addition to the photoelectric conversion layer that generates a hole-electron pair. An organic p-type semiconductor and an organic n-type semiconductor made of publicly known materials can be used for those organic semiconductor layers. The photodetection film 51 may be, for example, a mixed film of an organic donor molecule and an acceptor molecule, a mixed film of a semiconductor-type carbon nanotube and an acceptor molecule, a quantum dot-containing film, or the like.

The transparent electrode 52 is an example of a third electrode provided on an upper surface 51b side of the photodetection film 51 and includes a lower surface 52a and an upper surface 52b. The lower surface 52a is an example of a third surface facing the upper surface 51b of the photodetection film 51. The upper surface 52b is an example of a fourth surface on the opposite side of the lower surface 52a.

The transparent electrode 52 is arranged on the upper surface 51b of the photodetection film 51. To be specific, the transparent electrode 52 is provided to be put in contact with the upper surface 51b so as to cover an area of the upper surface 51b of the photodetection film 51 in which at least the multiple pixel electrodes 50 and the power supply-through wirings 62 are provided. In this embodiment, the transparent electrode 52 is formed to cover the entirety of the upper surface 51b of the photodetection film 51. For example, when viewed from the top, the shape of the transparent electrode 52 and the shape of the photodetection film 51 are the same. As illustrated in FIG. 5, a side surface 52s of the transparent electrode 52 and a side surface 51s of the photodetection film 51 are flush to each other. That is, there is no bump between the side surface 52s of the transparent electrode 52 and the side surface 51s of the photodetection film 51. The side surface 52s of the transparent electrode 52 and the side surface 51s of the photodetection film 51 are flat over the side surface 52s of the transparent electrode 52 and the side surface 51s of the photodetection film 51. Here is described an example where the side surface 52s and the side surface 51s are parallel to the normal direction of the semiconductor substrate 31; however, the side surface 52s and the side surface 51s may be inclined to be oblique with respect to the normal direction.

The transparent electrode 52 is transparent to the light that should be detected and is formed by using a material having the conductivity. For example, the transparent electrode 52 is formed by using a transparent conductive semiconductor oxide film such as indium tin oxide (ITO), aluminum doped zinc oxide (AZO), and gallium doped zinc oxide (GZO). The transparent electrode 52 may be formed by using another transparent conductive semiconductor or may be formed by using a thin metallic film that is thin enough to be transparent to the light.

In this embodiment, as illustrated in FIG. 4, when viewed from the top, the photodetection film 51 and the transparent electrode 52 have a rectangular shape. The two control electrodes 60 are arranged to be overlapped with sides 52e and 52f, which are out of four sides 52c, 52d, 52e, and 52f of the transparent electrode 52, respectively. Thus, the image sensor 101 includes the two connection portions 61. The two connection portions 61 are provided to cover the sides 52e and 52f of the transparent electrode 52, respectively. Each of the two connection portions 61 is joined to the control electrode 60 and the side surface 52s of the transparent electrode 52 and electrically connect the control electrode 60 and the transparent electrode 52 with each other.

The insulation layer 53 is formed to cover at least a part of the upper surface 52b of the transparent electrode 52. The insulation layer 53 is provided to be put in contact with the upper surface 52b so as to cover an area of the upper surface 52b of the transparent electrode 52 in which at least the multiple pixel electrodes 50 and the power supply-through wirings 62 are provided.

In this embodiment, as illustrated in FIG. 5, a through-hole 53a is provided in the insulation layer 53. The through-hole 53a is a contact hole for electrically connecting the connection portion 61 and the transparent electrode 52 with each other. A part of the transparent electrode 52 is exposed in the through-hole 53a.

The protection film 54 is provided on the upper surface 43a of the inter-layer insulation layer 43 while covering the connection portion 61 and the insulation layer 53.

The insulation layer 53 and the protection film 54 are formed by using a material having the insulation properties. For example, the insulation layer 53 is formed of silicon oxide, silicon nitride, silicon nitride oxide, an organic or inorganic polymeric material, or the like. The insulation layer 53 and the protection film 54 are, for example, transparent to the light having a wavelength that should be detected by the image sensor 101.

The control electrodes 60 are an example of second electrodes provided on the lower surface 51a side of the photodetection film 51. As illustrated in FIGS. 4 and 5, each control electrode 60 includes the first portion 60a and a second portion 60b. The first portion 60a is a portion overlapped with the lower surface 51a of the photodetection film 51 when viewed from the top. The second portion 60b is a portion not overlapped with the lower surface 51a of the photodetection film 51 when viewed from the top. In other words, the second portion 60b is an exposed portion that is not covered by the photodetection film 51.

In this embodiment, the control electrode 60 is provided in the same layer as that of the multiple pixel electrodes 50. To be specific, a lower surface of the control electrode 60 and lower surfaces of the multiple pixel electrodes 50 are at the same height from the semiconductor substrate 31. An upper surface of the control electrode 60 and upper surfaces of the multiple pixel electrodes 50 are at the same height from the semiconductor substrate 31. The control electrode 60 and the multiple pixel electrodes 50 may be, for example, formed through the same steps by using the same material.

The control electrode 60 is, for example, formed by using a material containing a metal and has the conductivity and the light-blocking properties. For example, the control electrode 60 is formed of a metallic film of titanium, tantalum aluminum, tungsten, aluminum into which silicon and copper are doped (AlSiCu), or the like, or a metallic film formed of an alloy of the above. Otherwise, the control electrode 60 may be formed by using a metallic nitride film of titanium nitride, tantalum nitride, tungsten nitride, or the like. Otherwise, the control electrode 60 may be formed by using a metallic carbide film of titanium carbide, tantalum carbide, tungsten carbide, or the like. The control electrode 60 may have a single layer structure of the above-described metallic film or metallic nitride film, or may have a lamination structure of multiple metallic films or metallic nitride films.

The control electrode 60 may be formed by using a material with higher corrosion resistance than that of the power supply-through wiring 62. The material with high corrosion resistance is, for example, a material that has the low reactivity to oxygen and moisture.

With the control electrode 60 formed by using the material with high corrosion resistance, it is possible to protect the power supply-through wiring 62 from oxygen gas and the like used for patterning of the photodetection film 51. Since the oxidation of the power supply-through wiring 62 is suppressed, it is possible to suppress the deterioration in the quality and the properties of the image sensor 101.

The connection portion 61 is an example of a wiring that allows for conduction between the control electrode 60 and the transparent electrode 52. In this embodiment, the connection portion 61 is an example of a film-shaped wiring that continuously covers the side surface 51s of the photodetection film 51 and the second portion 60b of the control electrode 60.

To be specific, the connection portion 61 joins the control electrode 60 exposed on the upper surface 43a of the inter-layer insulation layer 43 and the side surface 52s of the transparent electrode 52. Additionally, the connection portion 61 covers the side surface 51s of the photodetection film 51. Moreover, the connection portion 61 covers a part of the upper surface of the insulation layer 53 other than the area in which the pixel electrodes 50 are provided. In other words, the connection portion 61 is not overlapped with any of the multiple pixel electrodes 50 when viewed from the top.

Furthermore, a part of the connection portion 61 is positioned in the through-hole 53a and is physically and electrically connected to the transparent electrode 52. To be specific, the connection portion 61 covers a portion of the upper surface 52b of the transparent electrode 52 exposed in the through-hole 53a. Thus, the connection portion 61 is put in contact with each of the upper surface 52b of the transparent electrode 52, the inside of the through-hole 53a of the insulation layer 53, an upper surface and a side surface 53s of the insulation layer 53, the side surface 52s of the transparent electrode 52, the side surface 51s of the photodetection film 51, and the second portion 60b of the control electrode 60, and continuously covers them in this order.

A joining area of the connection portion 61 and the control electrode 60 may be greater or smaller than a joining area of the connection portion 61 and the transparent electrode 52. The joining area of the connection portion 61 and the control electrode 60 may be the same as the joining area of the connection portion 61 and the transparent electrode 52. As illustrated in FIG. 4, in this embodiment, when viewed from the top, the connection portion 61 is greater than the control electrode 60 and completely includes the control electrode 60. In other words, the connection portion 61 is put in contact with and covers the entirety of the second portion 60b of the control electrode 60.

The connection portion 61 is, for example, formed by using a material containing a metal and has the conductivity and the light-blocking properties. For example, the connection portion 61 is formed of a metallic film of titanium, aluminum, copper, tungsten, gold, silver, nickel, cobalt, aluminum into which silicon and copper are doped (AlSiCu), or the like, or a metallic film formed of an alloy of the above. Otherwise, the connection portion 61 may be formed by using a metallic nitride film of titanium nitride or the like. As with the control electrode 60, the connection portion 61 may have a single layer structure of the above-described metallic film or metallic nitride film, or may have a lamination structure of multiple metallic films or metallic nitride films.

The connection portion 61 may be formed by using a material with higher corrosion resistance than that of the power supply-through wiring 62. The material with high corrosion resistance is, for example, titanium nitride or the like. The material with high corrosion resistance is, for example, a material that has the low reactivity to oxygen and moisture.

The power supply-through wiring 62 is an example of a first conductive plug that is connected with the first portion 60a of the control electrode 60 and extends toward the semiconductor substrate 31. When viewed from the top, as illustrated in FIG. 4, the power supply-through wiring 62 is positioned inside the first portion 60a. In other words, the entirety of the portion connected to the power supply-through wiring 62 of the control electrode 60 is included in the first portion 60a. The power supply-through wiring 62 is electrically connected to the voltage control circuit 30 illustrated in FIG. 1.

As described above, in the image sensor 101 according to this embodiment, a portion of a voltage applying route from the control electrode 60 to the transparent electrode 52 that does not need the translucency is wired by the connection portion 61. Thus, it is possible to apply a voltage with a low wiring voltage to the transparent electrode 52, and a voltage variation in the photodetection film 51 is suppressed.

Consequently, the image sensor 101 capable of performing more stable image capturing is implemented. The image sensor 101 is used for an image capturing device of a mobile device that requires a less power consumption. Additionally, it is possible to implement an image capturing device capable of achieving high-speed electronic shutter or switching the spectral sensitivity properties at higher speed.

As illustrated in FIGS. 3 and 5, the power supply-through wiring 62 to the transparent electrode 52 is arranged immediately under the photodetection film 51, and the thin film-shaped connection portion 61 is used as a wiring material for making an electric connection with the transparent electrode 52. With this configuration, there is no need to secure an area in which a through wiring is arranged only for supplying the power to the transparent electrode 52 on the side of the photodetection film 51. Since the electric connection of the power supply-through wiring 62 and the transparent electrode 52 is made by the small size thin film-shaped connection portion 61, it is possible to suppress an enlargement of the element size.

[Manufacturing Method]

Subsequently, a method of manufacturing the image sensor 101 according to this embodiment is described with reference to FIGS. 6A to 6H. FIGS. 6A to 6H are cross-sectional views that each describe a step of the method of manufacturing the image sensor 101 according to this embodiment.

(A) Step of Preparing Circuit Unit

First, as illustrated in FIG. 6A, the circuit unit is prepared. To be specific, the semiconductor substrate 31 (not illustrated) on which the inter-layer insulation layer 43 is formed is prepared. As described above, the multiple pixel electrodes 50 and the control electrode 60 are provided on the upper surface 43a of the inter-layer insulation layer 43. The power supply-through wiring 62 is connected to the control electrode 60. To be more specific, the circuit unit has a structure illustrated in FIG. 2 for each pixel electrode 50, and the circuit unit can be created by using a publicly known method of manufacturing a semiconductor device.

(B) Step of Forming Photodetection Film

Next, as illustrated in FIG. 6B, a photodetection film 151 is formed on the upper surface 43a of the inter-layer insulation layer 43 so as to cover the multiple pixel electrodes 50 and the control electrode 60. A lower surface 151a of the photodetection film 151 is put in contact with the upper surface 43a of the inter-layer insulation layer 43, the multiple pixel electrodes 50, and the control electrode 60. The photodetection film 151 can be formed by the spin coating method, the inkjet method, the die coating method, the spray coating method, the vacuum deposition method, the screen printing method, or the like. The photodetection film 151 becomes the photodetection film 51 illustrated in FIG. 3 by being patterned into a predetermined shape in a following step.

(C) Step of Forming Transparent Conductive Film

Next, as illustrated in FIG. 6B, a transparent conductive film 152 is formed on the photodetection film 151. The transparent conductive film 152 is formed on an area of the photodetection film 151 in which the multiple pixel electrodes 50 are provided. A lower surface 152a of the transparent conductive film 152 is put in contact with an upper surface 151b of the photodetection film 151. The transparent conductive film 152 is, for example, formed by the sputtering method. The transparent conductive film 152 becomes the transparent electrode 52 illustrated in FIG. 3 by being patterned into a predetermined shape in the following step.

(D) Step of Forming Insulation Layer

Next, as illustrated in FIG. 6B, an insulation layer 153 is formed on the transparent conductive film 152. The insulation layer 153 is formed on an area of the transparent conductive film 152 in which at least the multiple pixel electrodes 50 are formed. A lower surface of the insulation layer 153 is put in contact with an upper surface 152b of the transparent conductive film 152. The insulation layer 153 can be, for example, formed by the atomic layer deposition (ALD) method, the chemical vapor deposition (CVD) method, the sputtering method, or the like. The insulation layer 153 becomes the insulation layer 53 by being patterned into a predetermined shape in the following step.

(E) Step of Patterning

Next, the patterning of the photodetection film 151, the transparent conductive film 152, and the insulation layer 153 is performed by removing a part of the photodetection film 151, a part of the transparent conductive film 152, and a part of the insulation layer 153. To be specific, as illustrated in FIG. 6C, a photosensitive resist 190 is formed on the insulation layer 153. For example, the photosensitive resist 190 is formed by the spin coating method. Next, the photosensitive resist 190 is exposed by using a photomask, and image development is performed to form a resist pattern 191 having a predetermined pattern is formed as illustrated in FIG. 6D.

Next, the resist pattern 191 is used to perform etching of the photodetection film 151, the transparent conductive film 152, and the insulation layer 153. The etching of the films is performed by dry etching, for example.

For example, the etching of the insulation layer 153 and the transparent conductive film 152 is performed by using gas containing halogen such as fluorine, chlorine, bromine, and iodine. In this case, gas containing at least either one of elements, fluorine or chlorine, may be used. Dry etching is performed by using the reactive ion etching (RIE) in which gas is converted into plasma by plasma discharge, and the insulation layer 153 and the transparent conductive film 152 are reacted with chemical species of the gas converted to plasma. For example, when the insulation layer 153 and the transparent conductive film 152 are formed by using a material containing nitride or silicon, the insulation layer 153 and the transparent conductive film 152 can be etched efficiently by using the above gas and etching methods.

On the other hand, the etching of the photodetection film 151 is performed by using gas containing oxygen. To be specific, a chamber is filled with the gas containing oxygen, and a part of the photodetection film 151 is oxidated by the chemical etching with oxidation reaction. Since the photodetection film 151 contains a lot of carbon, the photodetection film 151 can be removed as carbon oxide by the oxidation reaction with the oxygen gas.

Through the step of patterning, the photodetection film 51, the transparent electrode 52, and the insulation layer 153 in desired shapes are formed as illustrated in FIG. 6E. The side surface 51s of the photodetection film 51, the side surface 52s of the transparent electrode 52, and the side surface 53s of the insulation layer 53 are flush to each other.

In this process, the power supply-through wiring 62 is arranged in a position in which the power supply-through wiring 62 is completely covered by the photodetection film 51. The second portion 60b, which is a part of the control electrode 60, is exposed.

Additionally, in this embodiment, the through-hole 53a is formed as illustrated in FIG. 6F by removing a part of the insulation layer 53. To be specific, a resist pattern (not illustrated) of the insulation layer 53 that exposes only a position in which the through-hole 53a is formed is formed, and the resist pattern is used as a mask to remove the exposed portion of the insulation layer 53, and thus the through-hole 53a is formed. The formation of the through-hole 53a may be performed concurrently with the patterning of the insulation layer 153. The formation of the through-hole 53a is, for example, performed by dry etching, but also may be performed by wet etching.

(F) Step of Forming Connection Portion

Next, the connection portion 61 that electrically connects the side surface 52s of the transparent electrode 52 and the control electrode 60 is formed. To be specific, as illustrated in FIG. 6G, a conductive thin film 161 is formed on the entirety of the upper surface 43a of the inter-layer insulation layer 43 so as to put in contact with and cover the upper surface of the insulation layer 53, the side surface 53s of the insulation layer 53, the side surface 52s of the transparent electrode 52, and the side surface 51s of the photodetection film 51. The conductive thin film 161 can be formed by using the sputtering method, the vacuum deposition method, or the like.

Thereafter, a resist pattern (not illustrated) that exposes an area of the conductive thin film 161 in which at least the multiple pixel electrodes 50 are provided is formed, and the thus-formed resist pattern is used as a mask to remove a part of the conductive thin film 161 by etching. Thus, as illustrated in FIG. 6H, the connection portion 61 that is joined with the control electrode 60 in the upper surface 43a of the inter-layer insulation layer 43 and is joined with the side surface 52s and the upper surface 52b of the transparent electrode 52 is formed. Since the connection portion 61 is formed on an outer periphery of the element, if the size of the connection portion 61 is large, this may cause enlargement of the element size. For this reason, the connection portion 61 is formed of a conductive thin film to be formed in a bare minimum size.

(G) Step of Forming Protection Film

Next, for a case where the image sensor 101 includes the protection film 54, the protection film 54 that covers the connection portion 61 and the insulation layer 53 is formed on the upper surface 43a of the inter-layer insulation layer 43 as illustrated in FIG. 3. Thus, the image sensor 101 illustrated in FIG. 3 is created.

[Modification]

Here, a modification of the embodiment 1 is described.

FIG. 7 is a schematic top view of an image sensor 102 according to this modification without the protection film 54. As illustrated in FIG. 7, the shapes of the photodetection film 51, the transparent electrode 52, the control electrode 60, and the connection portion 61 viewed from the top are different from that in the embodiment 1. Hereinafter, different points from the embodiment 1 are mainly described, and descriptions of common points are omitted or simplified.

As illustrated in FIG. 7, the photodetection film 51 includes recess portions 51r when viewed from the top. In this modification, two recess portions 51r are provided in the photodetection film 51. The two recess portions 51r are recessed from the sides 52e and 52f toward the center, respectively. When viewed from the top, the shape of each of the recess portions 51r is rectangular; however, the shape is not limited thereto.

The position in which the recess portion 51r is provided is not particularly limited. For example, the recess portion 51r may be provided in at least one of four vertices of the rectangle of the photodetection film 51. In other words, the recess portion 51r may be provided so as to notch a corner of the rectangle. The shape of the recess portion 51r viewed from the top may be triangular, semicircular, or the like.

In this modification, the second portion 60b of the control electrode 60 is overlapped with the recess portion 51r when viewed from the top. The connection portion 61 is connected to the second portion 60b in the recess portion 51r.

Thus, in this modification, with the second portion 60b provided in the recess portion 51r, it is possible to secure a wiring route for supplying voltage from the control electrode 60 to the transparent electrode 52 while suppressing the enlargement of the element size. Additionally, as with an embodiment 2 described later, a distance from the side surface 51s of the photodetection film 51 to the pixel electrode 50 can be made partially long, and it is possible to obtain the stable and high-performance image sensor 101.

Embodiment 2

Subsequently, the embodiment 2 is described.

Figure 8:
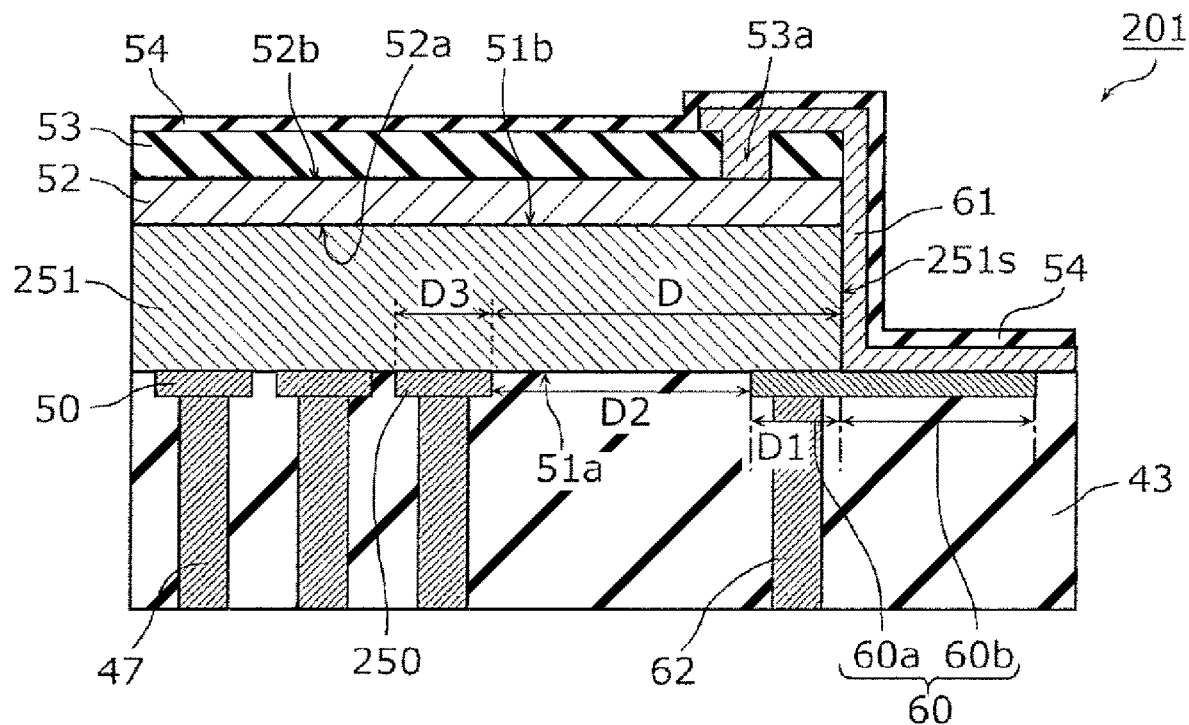
FIG. 8 is a schematic cross-sectional view illustrating in closeup a vicinity of an end portion of a photodetection film in an image sensor according to an embodiment 2.

FIG. 8 is a schematic cross-sectional view illustrating in closeup a vicinity of an end portion of a photodetection film 251 in an image sensor 201 according to this embodiment. As illustrated in FIG. 8, the image sensor 201 is different from the image sensor 101 according to the embodiment 1 in that the image sensor 201 includes the photodetection film 251 instead of the photodetection film 51. Hereinafter, different points from the embodiment 1 are mainly described, and descriptions of common points are omitted or simplified.

The photodetection film 251 includes a wider area in the end portion in which no pixel electrode 50 is provided than that of the photodetection film 51 according to the embodiment 1. To be specific, when viewed from the top, a distance D between an end portion of a pixel electrode 250, which is a pixel electrode 50 out of the multiple pixel electrodes 50 positioned at the endmost portion, and a side surface 251s of the photodetection film 251 is long.

As illustrated in FIG. 8, the distance D is indicated as a sum of a width D1 of the first portion 60a of the control electrode 60 and a distance D2 between the pixel electrode 250 and the control electrode 60. In this case, the distance D2 is longer than a width D3 of the pixel electrode 250, for example. The distance D2 may be longer than twice the width D3.

The distance D is, for example, longer than a portion in the end portion of the photodetection film 251 that may have a deterioration in the film quality. As with the case of the embodiment 1, oxygen plasma can be used for the etching of the photodetection film 251. However, the photodetection film 251 has properties that the performance is deteriorated due to exposing to oxygen or moisture. For this reason, the photodetection function is likely to be deteriorated in the end portion of the photodetection film 251 etched with oxygen plasma, and there is a possibility that the performance deterioration may has a bad effect on the pixel electrode 250.

According to the image sensor 201 in this embodiment, it is possible to secure the sufficient distance D from the side surface 251s of the photodetection film 251 to the pixel electrode 250, and thus it is possible to obtain the stable and high-performance image sensor 201.

[Modification]

Subsequently, a modification of the embodiment 2 is described.

Figure 9:
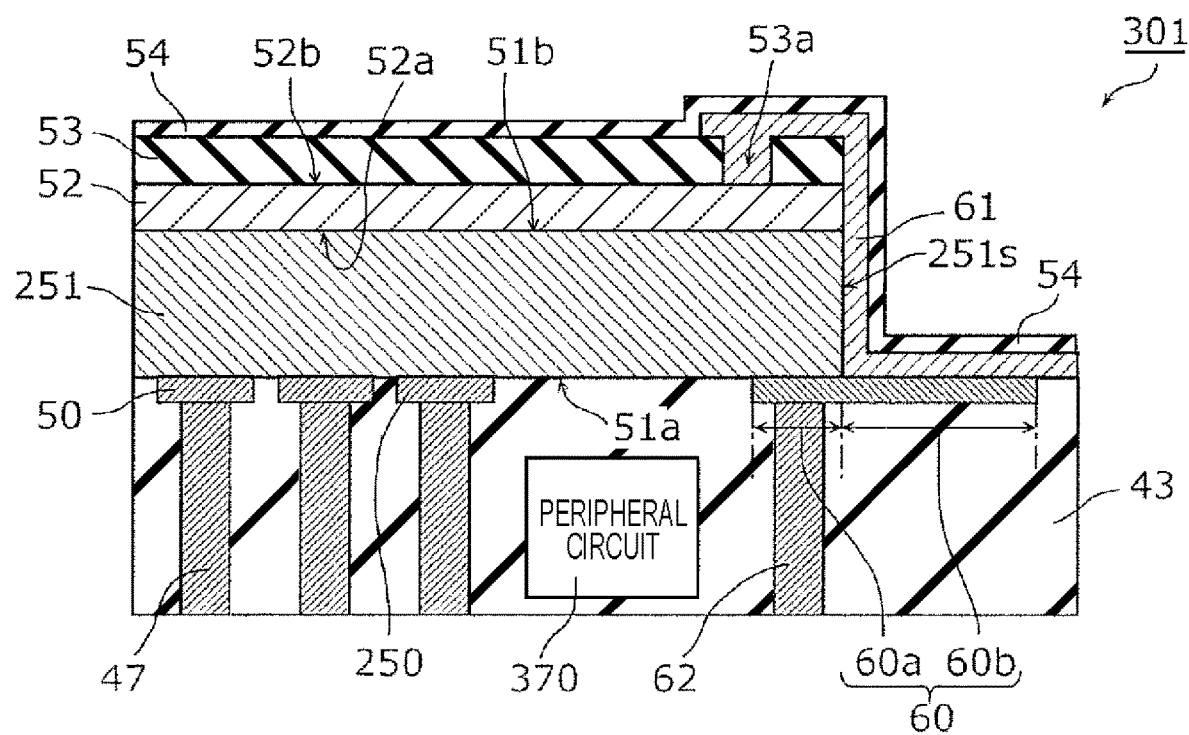
FIG. 9 is a schematic cross-sectional view illustrating in closeup a vicinity of the end portion of the photodetection film in an image sensor according to a modification of the embodiment 2.

FIG. 9 is a schematic cross-sectional view illustrating in closeup a vicinity of the end portion of the photodetection film 251 in an image sensor 301 according to this modification. As illustrated in FIG. 9, the image sensor 301 is different from the image sensor 201 according to the embodiment 2 in that a peripheral circuit 370 is positioned between the conductive plug 47 and the power supply-through wiring 62. Hereinafter, different points from the embodiment 2 are mainly described, and descriptions of common points are omitted or simplified.

The peripheral circuit 370 is, for example, at least one of the vertical scanning circuit 15, the horizontal signal reading circuit 20, the voltage control circuit 30, the load circuit 18, the column signal processing circuit 19, or the like illustrated in FIG. 1. FIG. 9 schematically illustrates that the peripheral circuit 370 is positioned in the inter-layer insulation layer 43; however, a part or all of the peripheral circuit 370 may be provided in the semiconductor substrate 31. In other words, in this modification, the peripheral circuit 370 is positioned between the conductive plug 47 connected to the pixel electrode 250 and the power supply-through wiring 62 when viewed from the top.

With this configuration, it is possible to effectively utilize the area of the end portion provided for securing the distance D from the side surface 251s of the photodetection film 251 to the pixel electrode 250. With the peripheral circuit 370 provided between the conductive plug 47 and the power supply-through wiring 62, it is possible to reduce other spaces and to suppress the enlargement of the element size.

Embodiment 3

Subsequently, an embodiment 3 is described.

Figure 10:
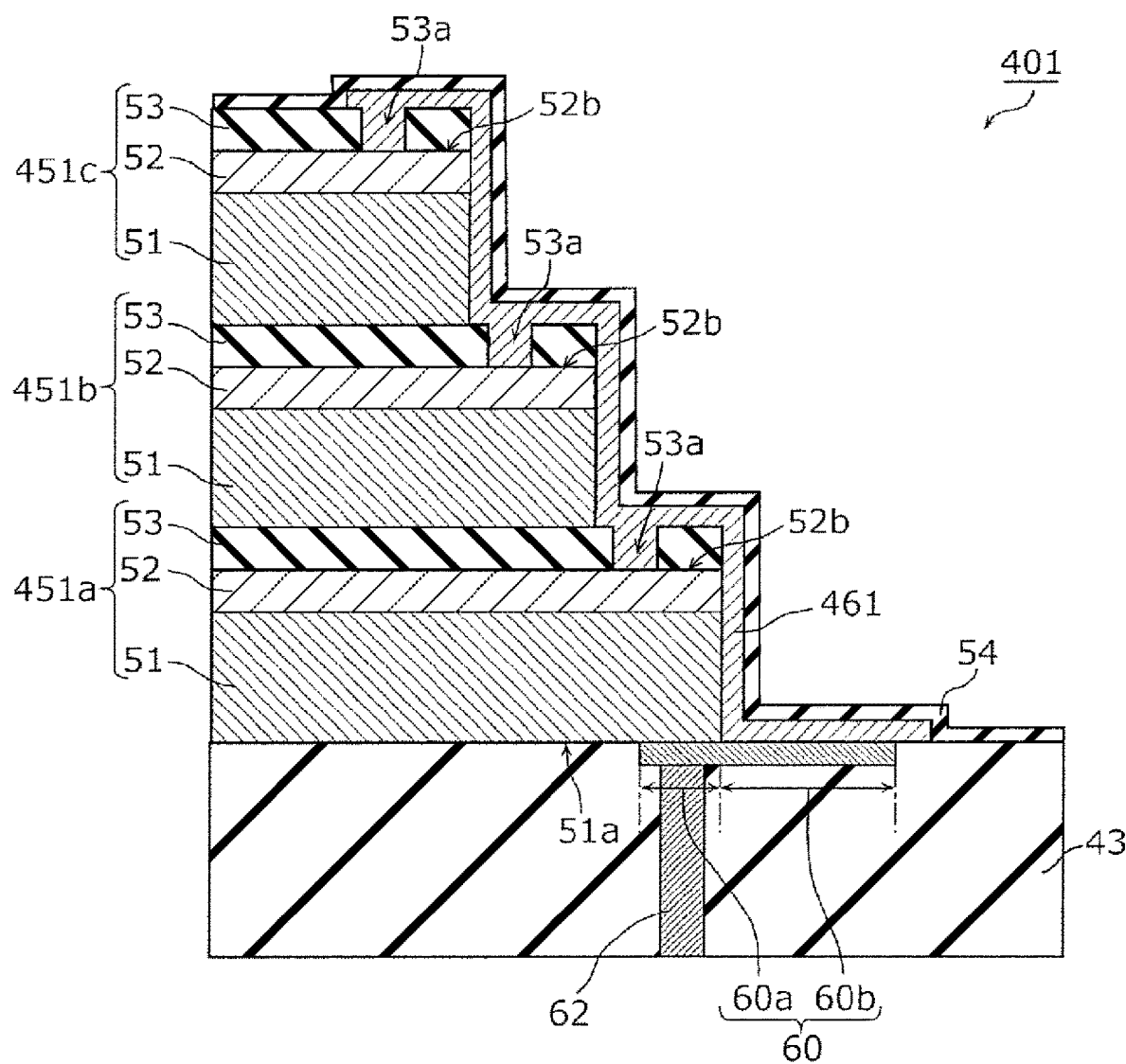
FIG. 10 is a schematic cross-sectional view illustrating in closeup a vicinity of the end portion of the photodetection film in an image sensor according to an embodiment 3.

FIG. 10 is a schematic cross-sectional view illustrating in closeup a vicinity of the end portion of the photodetection film 51 in an image sensor 401 according to this embodiment. As illustrated in FIG. 10, the image sensor 401 is different from the image sensor 101 according to the embodiment 1 in that the image sensor 401 includes multiple lamination structures of the photodetection film 51, the transparent electrode 52, and the insulation layer 53. To be specific, the image sensor 401 includes three lamination structures 451a, 451b, and 451c. The three lamination structures 451a, 451b, and 451c are laminated in the normal direction of the semiconductor substrate 31. Additionally, the image sensor 401 includes a connection portion 461 instead of the connection portion 61. Hereinafter, different points from the embodiment 1 are mainly described, and descriptions of common points are omitted or simplified.

In this embodiment, end portions of the three lamination structures 451a, 451b, and 451c are provided in the form of stairs. To be specific, at least a part of the end portion of the upper surface 52b of the transparent electrode 52 in each of the three lamination structures 451a, 451b, and 451c is not overlapped with the other lamination structures when viewed from the top.

For example, the upper surface 52b of the transparent electrode 52 in the lamination structure 451a that is closest to the semiconductor substrate 31, or on the lowermost step, is not overlapped with the lamination structures 451b and 451c when viewed from the top. The upper surface 52b of the transparent electrode 52 in the lamination structure 451b positioned on a middle step is not overlapped with the lamination structure 451c when viewed from the top. The insulation layer 53 of each of the three lamination structures 451a, 451b, and 451c is provided with the through-hole 53a for exposing a part of the upper surface 52b of the transparent electrode 52. The through-holes 53a in the corresponding three lamination structures 451a, 451b, and 451c are not overlapped with each other when viewed from the top.

The photodetection films 51 included in the corresponding three lamination structures 451a, 451b, and 451c have, for example, different wavelengths of the light as the detection target. For example, the photodetection films 51 included in the corresponding three lamination structures 451a, 451b, and 451c detect red color light, green color light, and blue color light and generate signal charges according to the intensity of the light, respectively. Thus, the image sensor 401 can generate a color image even without providing the color filter 55.

The connection portion 461 is put in contact with and covers the upper surfaces 52b of the transparent electrodes 52 included in the three lamination structures 451a, 451b, and 451c and the side surfaces of the three lamination structures 451a, 451b, and 451c. To be specific, the connection portion 461 is continuously put in contact with and covers the upper surface 52b of the transparent electrode 52 of the lamination structure 451c on the uppermost step, a side surface of the lamination structure 451c, the upper surface 52b of the transparent electrode 52 of the lamination structure 451b on the middle step, a side surface of the lamination structure 451b, the upper surface 52b of the transparent electrode 52 of the lamination structure 451a on the lowermost step, a side surface of the lamination structure 451a, and the second portion 60b of the control electrode 60 in this order. Each of the side surfaces of the lamination structures 451c, 451b, and 451a includes the side surface 53s of the insulation layer 53, the side surface 52s of the transparent electrode 52, and the side surface 51s of the photodetection film 51.

Although it is not illustrated, the multiple pixel electrodes 50 are connected to each of the lower surface 51a of the photodetection film 51 in corresponding one of the three lamination structures 451a, 451b, and 451c. The conductive plug 47 is connected to the lower surface of each of the multiple pixel electrodes 50. In this case, the conductive plug 47 connected to the pixel electrode 50 for the photodetection film 51 in the lamination structure 451c on the uppermost step penetrates through the lamination structure 451b on the middle step and the lamination structure 451a on the lowermost step. The conductive plug 47 connected to the pixel electrode 50 for the photodetection film 51 in the lamination structure 451b on the middle step penetrates through the lamination structure 451a on the lowermost step. With this configuration, the photodetection film 51 in each lamination structure can perform the photoelectric conversion in the portion connected to the pixel electrode 50 and accumulate the signal charges in the charge accumulation node 24 through the pixel electrode 50 and the conductive plug 47.

As described above, according to this embodiment, since the wavelength bands of light detected by the multiple photodetection films 51 can be different from each other, the detection results can be utilized in various applications.

In this embodiment, the example where the three lamination structures are laminated is described; however, two lamination structures may be laminated, or four or more lamination structures may be laminated. For example, when two lamination structures are laminated, the photodetection film 51 in one lamination structure may detect infrared light, and the photodetection film 51 in the other lamination structure may detect visible light. The number of the lamination of the lamination structures and the wavelength of the light as the detection target are not particularly limited.

[Modification]

Next, a modification of the embodiment 3 is described.

Figure 11:
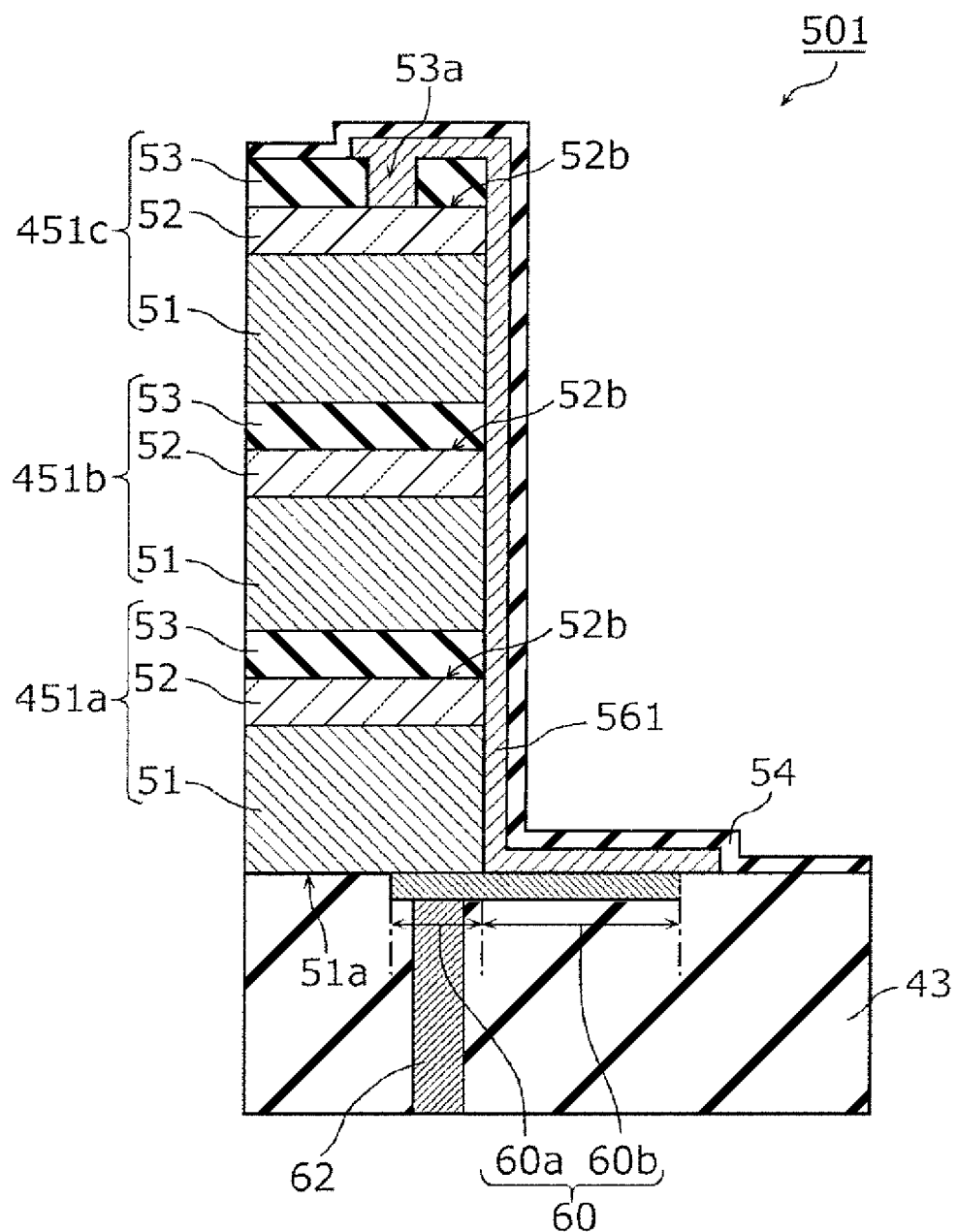
FIG. 11 is a schematic cross-sectional view illustrating in closeup a vicinity of the end portion of the photodetection film in an image sensor according to a modification of the embodiment 3.

FIG. 11 is a schematic cross-sectional view illustrating in closeup a vicinity of the end portion of the photodetection film 51 in an image sensor 501 according to this modification. As illustrated in FIG. 11, the image sensor 501 is different from the image sensor 401 according to the embodiment 3 in that the side surfaces of the three lamination structures 451a, 451b, and 451c are flush to each other. Hereinafter, different points from the embodiment 3 are mainly described, and descriptions of common points are omitted or simplified.

In this modification, since the side surfaces of the three lamination structures 451a, 451b, and 451c are flush to each other, or the side surfaces of the three lamination structures 451a, 451b, and 451c are flat over the three lamination structures 451a, 451b, and 451c, the upper surfaces 52b of the transparent electrodes 52 in the lamination structures other than the lamination structure 451c on the uppermost step are each covered by a lamination structure positioned above. Consequently, in this modification, voltages are supplied to the transparent electrode 52 in the lamination structure 451b on the middle step and the transparent electrode 52 in the lamination structure 451a on the lowermost step through the side surfaces 52s of the transparent electrodes 52. The through-hole 53a is provided in the insulation layer 53 in the lamination structure 451c on the uppermost step to expose a part of the upper surface 52b of the transparent electrode 52.

The image sensor 501 includes a connection portion 561 instead of the connection portion 461. The connection portion 561 is put in contact with and covers the side surfaces of the three lamination structures 451a, 451b, and 451c. To be specific, the connection portion 561 is continuously put in contact with and covers the upper surface 52b of the transparent electrode 52 in the lamination structure 451c on the uppermost step, the side surface of the lamination structure 451c, the side surface of the lamination structure 451b on the middle step, the side surface of the lamination structure 451a on the lowermost step, and the second portion 60b of the control electrode 60 in this order.

As described above, according to this modification, since the side surfaces of the lamination structures are flush to each other, it is possible to further suppress the enlargement of the element size.

The insulation layer 53 in the lamination structure 451c on the uppermost step may not include the through-hole 53a. Voltages may be supplied to all the transparent electrodes 52 in the three lamination structures 451a, 451b, and 451c through the side surfaces 52s of the transparent electrodes 52.

Figure 12:
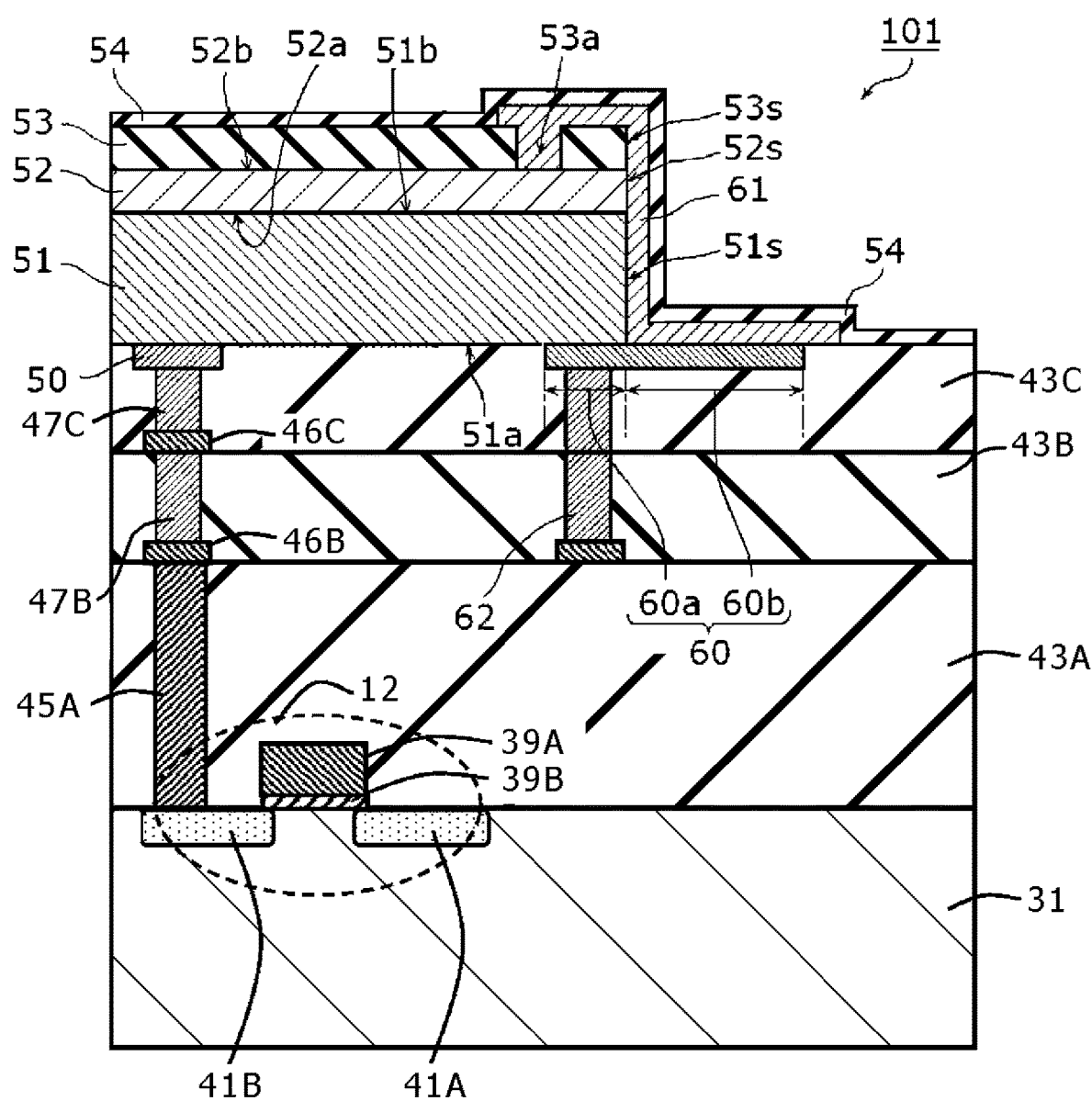
FIG. 12 is a schematic cross-sectional view illustrating in closeup a vicinity of the end portion of the photodetection film in the image sensor according to the embodiment 1 with a semiconductor substrate.

FIG. 12 is a schematic cross-sectional view illustrating in closeup a vicinity of the end portion of the photodetection film 51 in the image sensor 101 according to the embodiment 1 with the semiconductor substrate 31. FIG. 12 is different from FIG. 5 in that FIG. 12 illustrates the inter-layer insulation layers 43A, 43B, and 43C and the semiconductor substrate 31. FIG. 12 further illustrates the reset transistor 12, the wirings, the plugs, and so on. Hereinafter, different points from FIG. 5 are mainly described, and descriptions of common points are omitted or simplified.

The pixel electrode 50 and the control electrode 60 are provided between the photodetection film 51 and the semiconductor substrate 31. When viewed from the normal direction of the semiconductor substrate 31, the power supply-through wiring 62 is overlapped with the photodetection film 51, and thus the photodetection film 51 functions as a protection film for the power supply-through wiring 62. Consequently, the power supply-through wiring 62 as the first conductive plug is likely to be protected from a substance such as moisture or oxygen that may cause the property deterioration, and thus it is possible to suppress the property deterioration of the photoelectric conversion device.

A multi-layer wiring structure is provided on the upper surface of the semiconductor substrate 31. The multi-layer wiring structure includes multiple inter-layer insulation layers, one or more wiring layers, one or more plugs, and one or more contact plugs. To be specific, the inter-layer insulation layers 43A, 43B, and 43C are laminated on the upper surface of the semiconductor substrate 31. The contact plug 45A is embedded in the inter-layer insulation layer 43A. The wiring 46B and the conductive plug 47B are embedded in the inter-layer insulation layer 43B. The wiring 46C and the conductive plug 47C are embedded in the inter-layer insulation layer 43C. The power supply-through wiring 62 may pass through the above-described multiple inter-layer insulation layers. With this configuration, the wiring layer is formed as multi-layer, and thus it is possible to make an area taken by the wiring layer small when the substrate is viewed in plan view and to suppress the enlargement of the element size.

Other Embodiments

Photoelectric conversion devices according to one or more aspects are described above based on the embodiments; however, the present disclosure is not limited to those embodiments. The embodiments modified in various ways considered by the skilled in the art and modes constructed by combining the constituents in different embodiments are included within the scope of the present disclosure without departing from the gist of the present disclosure.

For example, the image sensor 101 may detect a capacity change in the photodetection film 51 without detecting the charges from the photoelectric conversion. The image sensor and the image capturing device of this type are disclosed in International Publication No. WO 2017/081847, for example. In other words, the photodetection film 51 may generate a hole-electronic pair according to the intensity of the incident light, or the capacity may be changed according to the intensity of the incident light. In each pixel 14, it is possible to detect the incident light in the photodetection film 51 by detecting the generated charge or the capacity change.

For example, the multiple pixel electrodes 50 and the control electrodes 60 may be provided in different layers. In other words, the heights of the multiple pixel electrodes 50 from the semiconductor substrate 31 may be different from the heights of the control electrodes 60 from the semiconductor substrate 31. For example, the control electrodes 60 may be provided in a position closer to the upper surface 43a of the inter-layer insulation layer 43 than the semiconductor substrate 31. To be specific, the control electrodes 60 may be provided between the inter-layer insulation layer 43B and the inter-layer insulation layer 43C.

Various changes, replacements, additions, omissions, and the like can be made in each of the above-described embodiments within the scope of the claims or the scope of the equivalent thereof.

The present disclosure can be utilized as a photoelectric conversion device with high quality and high performance in which the enlargement of the element size is suppressed, and can be utilized in, for example, a camera, a ranging device, and so on.

What is claimed is:
1. A photoelectric conversion device, comprising:
a substrate;
a photodetection film that includes a first surface facing the substrate and a second surface opposite to the first surface;
a plurality of pixels disposed in a pixel region, each of the plurality of pixels including a first electrode that is provided between the substrate and the photodetection film, and overlaps the photodetection film when viewed from a normal direction of the substrate;
a second electrode that is provided between the substrate and the photodetection film and includes a first portion overlapping the first surface and a second portion not overlapping the first surface when viewed from the normal direction of the substrate, the second electrode being disposed outside the pixel region when viewed from the normal direction of the substrate;
a third electrode that is provided on the second surface of the photodetection film and includes a third surface facing the second surface;
wiring that electrically connects the second electrode and the third electrode; and a first conductive plug that is connected with the first portion of the second electrode and extends toward the substrate, wherein material of the first conductive plug is different from material of the second electrode, and the wiring is in contact with a side surface of the photodetection film and the second portion of the second electrode.

2. The photoelectric conversion device according to claim 1, further comprising:

a multi-layer wiring structure that is arranged between the substrate and the photodetection film and includes a plurality of inter-layer insulation layers, wherein the first conductive plug passes through the plurality of inter-layer insulation layers.

3. The photoelectric conversion device according to claim 1, wherein corrosion resistance of material of the wiring is higher than corrosion resistance of the material of the first conductive plug.

4. The photoelectric conversion device according to claim 1, wherein a shape in plan view, which is viewed from the normal direction of the substrate, of the photodetection film includes a recess portion, the second portion of the second electrode overlaps the recess portion when viewed from the normal direction of the substrate, and the wiring is connected to the second portion of the second electrode in the recess portion.

5. The photoelectric conversion device according to claim 1, wherein:

each of the plurality of pixels further comprises a second conductive plug in contact with the first conductive plug and extending toward the substrate, the photoelectric conversion device further comprises a peripheral circuit that is positioned between the first conductive plug and the second conductive plug when viewed from the normal direction of the substrate.

6. The photoelectric conversion device according to claim 1, further comprising:

a wiring layer arranged between the substrate and the photodetection film or an electric element provided on the substrate, wherein an entirety of a portion connected with the first conductive plug in the second electrode is included in the first portion, and the first conductive plug is connected with the wiring layer or the electric element.

7. The photoelectric conversion device according to claim 1, further comprising:

a plurality of inter-layer insulation layers that are arranged between the substrate and the photodetection film, wherein the first electrode of the plurality of pixels is in contact with the first surface, and the first electrode of the plurality of pixels and the second electrode are provided in a same layer in the plurality of inter-layer insulation layers.

8. The photoelectric conversion device according to claim 1, wherein the third electrode includes a fourth surface opposite to the third surface, and the wiring continuously covers the fourth surface of the third electrode, a side surface of the photodetection film, and the second portion of the second electrode.

9. The photoelectric conversion device according to claim 1, further comprising:

a plurality of lamination structures that each include the photodetection film and the third electrode, wherein the plurality of lamination structures are laminated on each other in the normal direction of the substrate.

10. The photoelectric conversion device according to claim 9, wherein end portions of the plurality of lamination structures are provided in a form of stairs.

11. The photoelectric conversion device according to claim 9, wherein side surfaces of the plurality of lamination structures are flat over the plurality of lamination structures.

12. The photoelectric conversion device according to claim 1, wherein the wiring has a film shape.

13. The photoelectric conversion device according to claim 1, wherein the wiring is in direct contact with the side surface of the photodetection film.

14. A photoelectric conversion device, comprising:

a substrate;

a photodetection film that includes a first surface facing the substrate and a second surface opposite to the first surface;

a plurality of first electrodes that are provided between the substrate and the photodetection film;

a second electrode that is provided between the substrate and the photodetection film and includes a first portion overlapping the first surface and a second portion not overlapping the first surface when viewed from a normal direction of the substrate;

a third electrode that is provided on the second surface of the photodetection film and includes a third surface facing the second surface;

wiring that electrically connects the second electrode and the third electrode; and a first conductive plug that is connected with the first portion of the second electrode and extends toward the substrate, wherein the first conductive plug includes a portion that does not overlap the second portion of the second electrode when viewed from the normal direction of the substrate.

* * * * *